(12) United States Patent
Yamazaki et al.

(10) Patent No.: US 9,755,167 B2
(45) Date of Patent: Sep. 5, 2017

(54) LIGHT-EMITTING DEVICE

(71) Applicant: Semiconductor Energy Laboratory Co., Ltd., Kanagawa-ken (JP)

(72) Inventors: Shunpei Yamazaki, Tokyo (JP); Daiki Nakamura, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 68 days.

(21) Appl. No.: 14/681,444

(22) Filed: Apr. 8, 2015

(65) Prior Publication Data

US 2015/0292716 A1    Oct. 15, 2015

(30) Foreign Application Priority Data

Apr. 11, 2014  (JP) ................................ 2014-081828

(51) Int. Cl.

| | | |
|---|---|---|
| *F21S 4/00* | (2016.01) | |
| *F21V 21/00* | (2006.01) | |
| *H01L 51/00* | (2006.01) | |
| *F21Y 103/00* | (2016.01) | |
| *F21Y 115/20* | (2016.01) | |

(Continued)

(52) U.S. Cl.
CPC ...... *H01L 51/0097* (2013.01); *F21Y 2103/00* (2013.01); *F21Y 2115/20* (2016.08); *H01L 2251/5338* (2013.01); *H01L 2251/5361* (2013.01); *H05K 1/028* (2013.01); *H05K 1/147* (2013.01); *H05K 1/189* (2013.01); *H05K 2201/047* (2013.01); *H05K 2201/10106* (2013.01); *H05K 2201/10113* (2013.01); *H05K 2201/2018* (2013.01)

(58) Field of Classification Search
CPC ......... H01L 51/0097; H01L 2251/5338; H01L 2251/5361; F21Y 2115/20; F21Y 103/00; H05K 1/028; H05K 1/147; H05K 1/189; H05K 2201/047; H05K 2201/10106; H05K 2201/10113; H05K 2201/2018
USPC .. 362/249.08, 84, 152, 217.15, 249.05, 320; 313/504, 512, 511
See application file for complete search history.

(56) References Cited

U.S. PATENT DOCUMENTS 5,821,138 A   10/1998   Yamazaki et al.
6,846,696 B2   1/2005   Adachi et al.
(Continued)

FOREIGN PATENT DOCUMENTS

CN   101479523 A   7/2009
CN   101996535 A   3/2011
(Continued)

OTHER PUBLICATIONS

International Search Report re Application No. PCT/IB2015/052477, dated Jul. 28, 2015.
(Continued)

*Primary Examiner* — Anh Mai
*Assistant Examiner* — Glenn Zimmerman
(74) *Attorney, Agent, or Firm* — Husch Blackwell LLP

(57) ABSTRACT

A novel light-emitting device that is highly convenient or reliable is provided. The light-emitting device includes a framework, a flexible first light-emitting panel supported by the framework so as to form a first developable surface, and a flexible second light-emitting panel supported by the framework so as to form a second developable surface.

13 Claims, 16 Drawing Sheets

(51) Int. Cl.
　　*H05K 1/02* (2006.01)
　　*H05K 1/14* (2006.01)
　　*H05K 1/18* (2006.01)

(56) References Cited

U.S. PATENT DOCUMENTS

| | | |
|---|---|---|
| 6,946,361 B2 | 9/2005 | Takayama et al. |
| 7,056,810 B2 | 6/2006 | Yamazaki et al. |
| 7,180,091 B2 | 2/2007 | Yamazaki et al. |
| 7,189,631 B2 | 3/2007 | Yamazaki et al. |
| 7,282,380 B2 | 10/2007 | Maruyama et al. |
| 7,335,573 B2 | 2/2008 | Takayama et al. |
| 7,351,300 B2 | 4/2008 | Takayama et al. |
| 7,521,383 B2 | 4/2009 | Morisue et al. |
| 7,867,907 B2 | 1/2011 | Shimomura et al. |
| 8,030,132 B2 | 10/2011 | Ogita et al. |
| 8,110,442 B2 | 2/2012 | Jinbo |
| 8,367,440 B2 | 2/2013 | Takayama et al. |
| 8,415,208 B2 | 4/2013 | Takayama et al. |
| 8,430,530 B2 | 4/2013 | Aurongzeb et al. |
| 8,982,545 B2 | 3/2015 | Kim et al. |
| 9,354,385 B2 | 5/2016 | An et al. |
| 9,523,875 B2 | 12/2016 | Kim |
| 9,551,893 B2 | 1/2017 | An et al. |
| 2008/0007936 A1* | 1/2008 | Liu .................... F21S 10/02 362/84 |
| 2011/0050657 A1 | 3/2011 | Yamada |
| 2011/0249425 A1 | 10/2011 | Aurongzeb et al. |
| 2012/0113632 A1* | 5/2012 | Aoyama ............... F21V 7/00 362/231 |
| 2012/0217516 A1 | 8/2012 | Hatano et al. |
| 2013/0002133 A1 | 1/2013 | Jin et al. |
| 2014/0103321 A1 | 4/2014 | Furukawa et al. |
| 2014/0306260 A1 | 10/2014 | Yamazaki et al. |
| 2014/0321074 A1 | 10/2014 | Chida et al. |
| 2015/0255740 A1 | 9/2015 | Nakada et al. |
| 2015/0261352 A1 | 9/2015 | Miyake |
| 2015/0355763 A1 | 12/2015 | Miyake et al. |

FOREIGN PATENT DOCUMENTS

| | | |
|---|---|---|
| CN | 102812291 A | 12/2012 |
| CN | 102855821 A | 1/2013 |
| DE | 102012211232 A1 | 1/2013 |
| EP | 2 709 182 A1 | 3/2014 |
| JP | 09-165930 A | 6/1997 |
| JP | 2005-017398 A | 1/2005 |
| JP | 2005-017399 A | 1/2005 |
| JP | 2007-333818 A | 12/2007 |
| JP | 2009-543348 | 12/2009 |
| JP | 2010-262210 A | 11/2010 |
| JP | 2011-047976 A | 3/2011 |
| JP | 2011-047977 A | 3/2011 |
| JP | 2011-170350 A | 9/2011 |
| JP | 2012-65956 | 4/2012 |
| JP | 2012-190794 | 10/2012 |
| JP | 2013-015835 A | 1/2013 |
| JP | 2013-528897 | 7/2013 |
| JP | 2014-038309 A | 2/2014 |
| KR | 2009-0026776 A | 3/2009 |
| KR | 2013-0007311 A | 1/2013 |
| KR | 2013-0041781 A | 4/2013 |
| TW | 200806070 | 1/2008 |
| TW | 201311066 | 3/2013 |
| WO | WO 2004/114013 A1 | 12/2004 |
| WO | WO 2008/005610 A1 | 1/2008 |
| WO | WO 2011/126665 A2 | 10/2011 |
| WO | WO 2012/153603 A1 | 11/2012 |

OTHER PUBLICATIONS

Written Opinion re Application No. PCT/IB2015/052477, dated Jul. 28, 2015.

* cited by examiner

FIG. 12A1
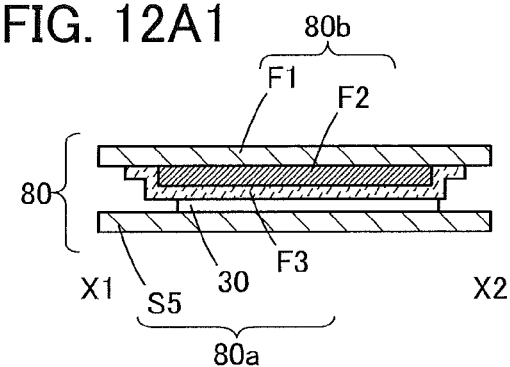
FIG. 12A2
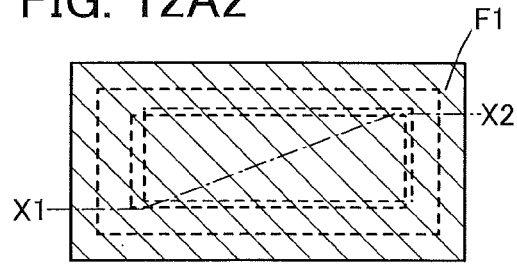
FIG. 12B1
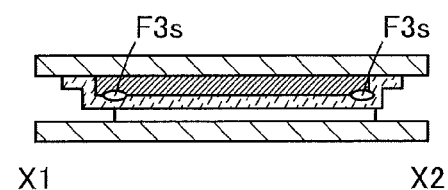
FIG. 12B2
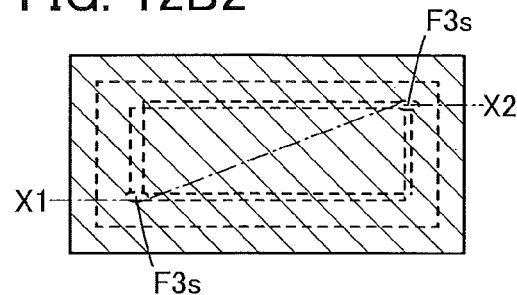
FIG. 12C
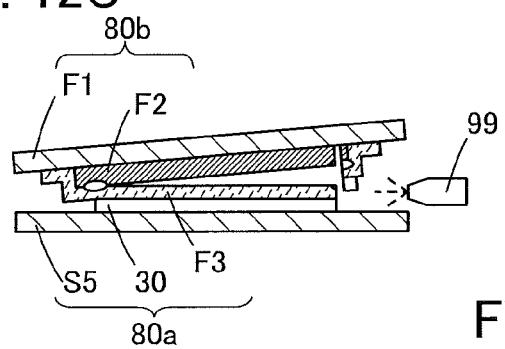
FIG. 12D1
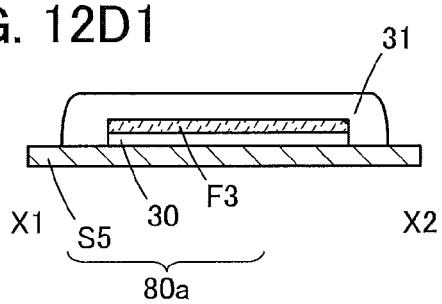
FIG. 12D2
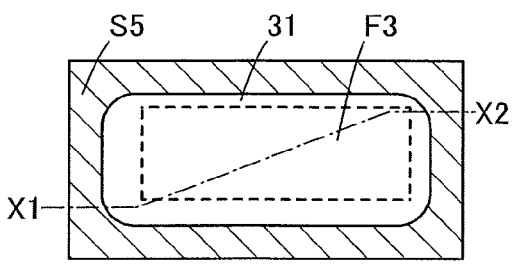
FIG. 12E1
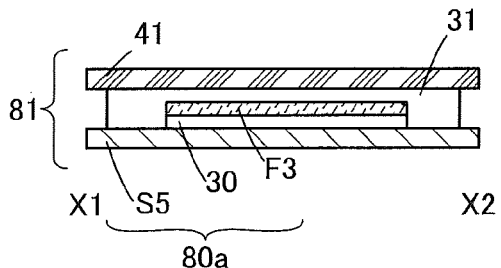
FIG. 12E2
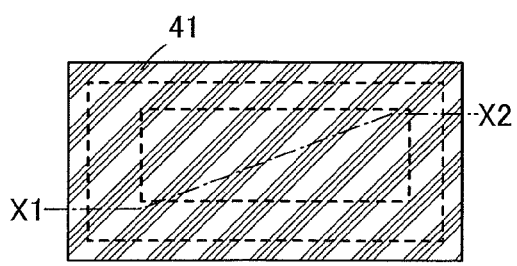

FIG. 13A1
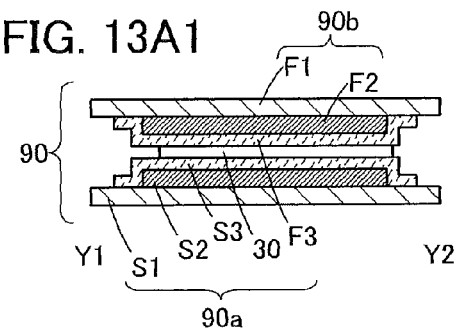
FIG. 13A2
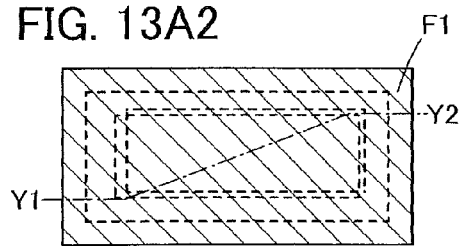
FIG. 13B1
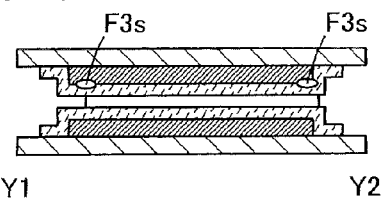
FIG. 13B2
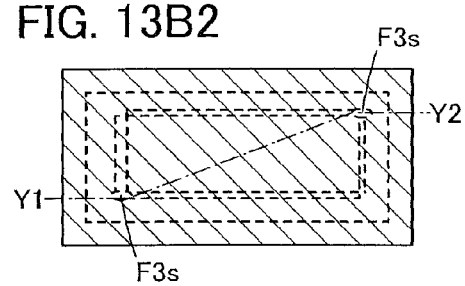
FIG. 13C
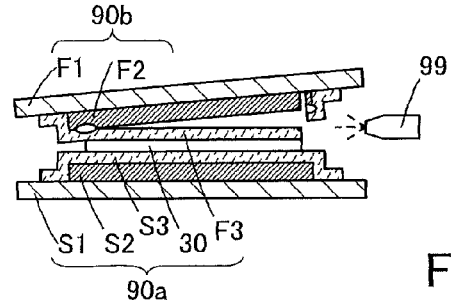
FIG. 13D1
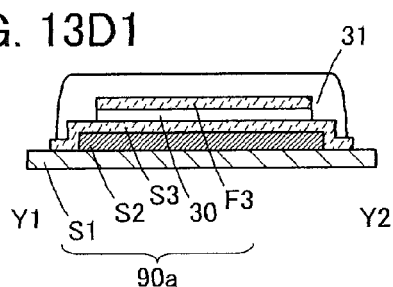
FIG. 13D2
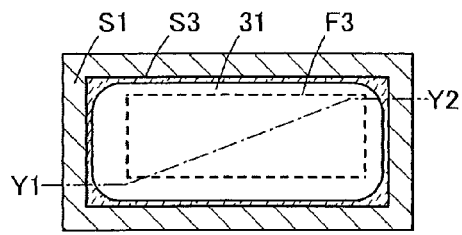
FIG. 13E1
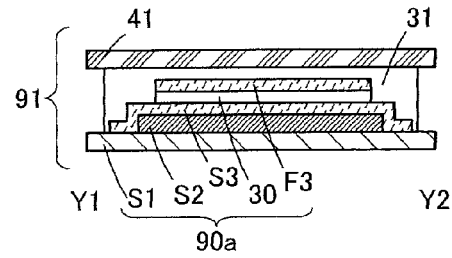
FIG. 13E2
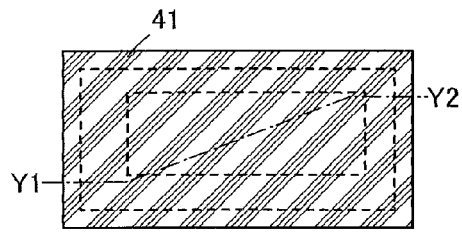

FIG. 14A1
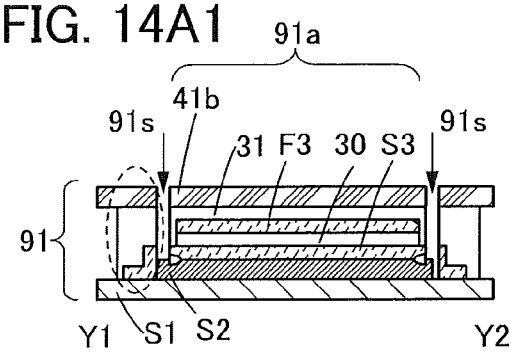
FIG. 14A2
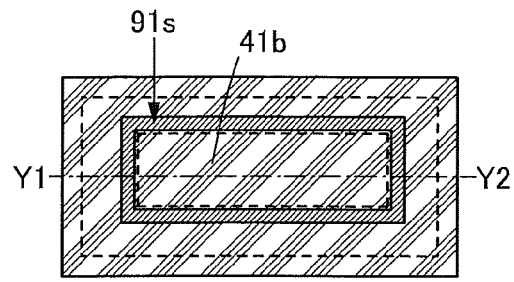
FIG. 14B
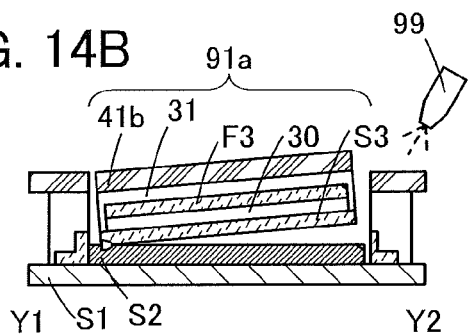
FIG. 14C
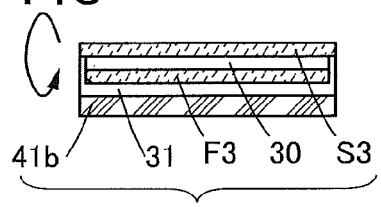
FIG. 14D1
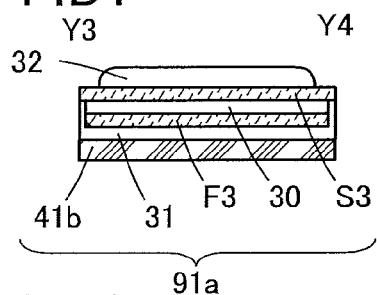
FIG. 14D2
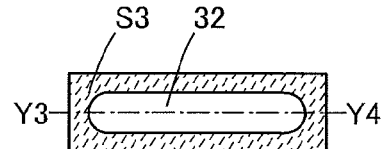
FIG. 14E1
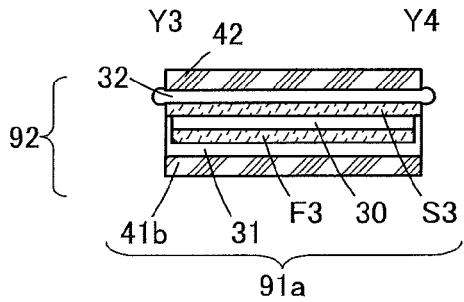
FIG. 14E2
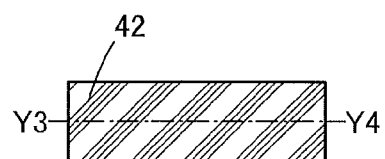

FIG. 15A1
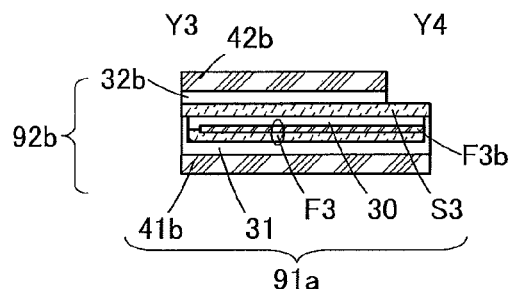
FIG. 15A2
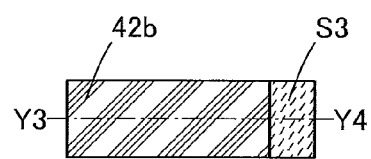
FIG. 15B1
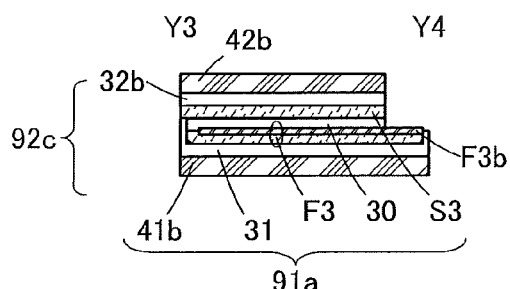
FIG. 15B2
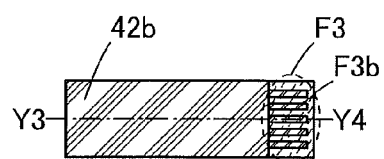
FIG. 15C1
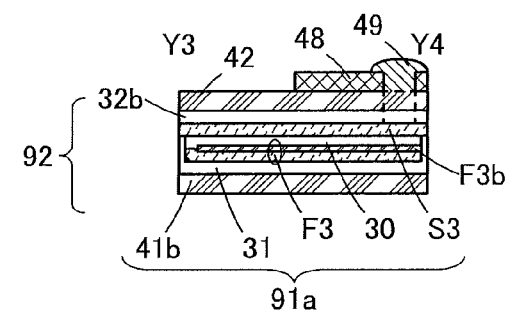
FIG. 15C2
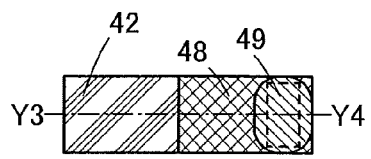
FIG. 15D1
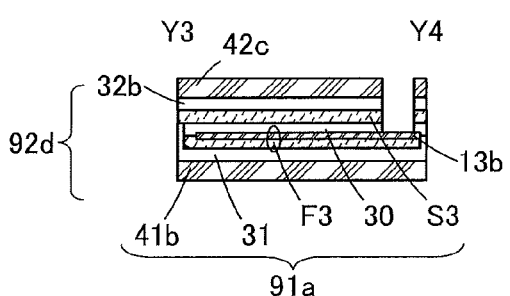
FIG. 15D2
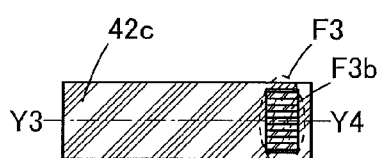

FIG. 16A1
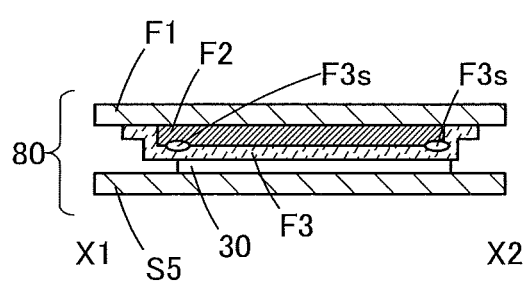
FIG. 16A2
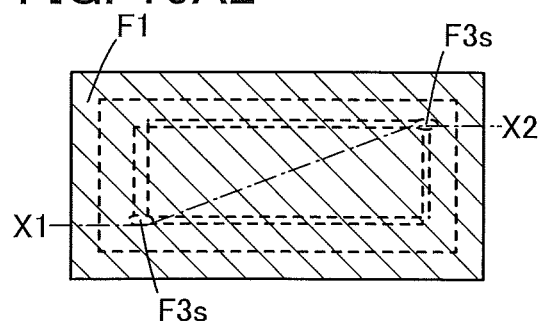
FIG. 16B1
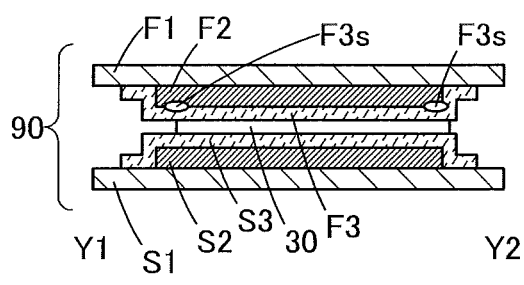
FIG. 16B2
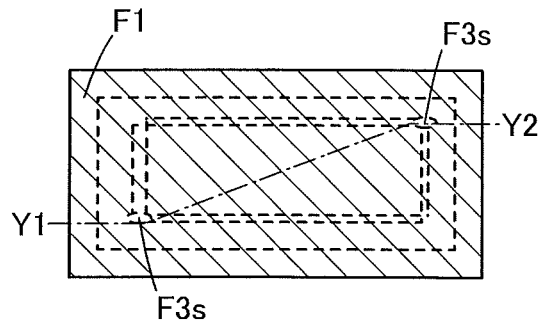

LIGHT-EMITTING DEVICE

TECHNICAL FIELD

One embodiment of the present invention relates to a light-emitting device, a display device, or an input/output device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A design that can arouse consumer appetite and contribute to industry development and an invention that can realize the design have been required.

For example, a light-emitting device that has a curved surface and a simple structure has been required.

Force might be accidentally applied when a light-emitting device is dropped. As an example of a light-emitting device that is not easily broken, a light-emitting device having high adhesiveness between a structure body by which a light-emitting layer is divided and a second electrode layer is known (Patent Document 1).

REFERENCE

Patent Document

[Patent Document 1] Japanese Published Patent Application No. 2012-190794

DISCLOSURE OF INVENTION

An object of one embodiment of the present invention is to provide a novel light-emitting device that is highly convenient or reliable. Another object of one embodiment of the present invention is to provide a novel display device that is highly convenient or reliable. Another object is to provide a novel input/output device that is highly convenient or reliable. Another object is to provide a novel light-emitting device, a novel display device, a novel input/output device, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a framework, a flexible first light-emitting panel supported by the framework, and a flexible second light-emitting panel supported by the framework.

The framework includes a curved portion supporting the first light-emitting panel and the second light-emitting panel, a first straight portion supporting the first light-emitting panel so that a first developable surface is formed between the curved portion and the first straight portion, and a second straight portion supporting the second light-emitting panel so that a second developable surface which is different from the first developable surface is formed between the curved portion and the second straight portion.

The first light-emitting panel includes a first light-emitting element and a first terminal portion electrically connected to the first light-emitting element.

The second light-emitting panel includes a second light-emitting element and a second terminal portion electrically connected to the second light-emitting element.

Another embodiment of the present invention is the above-described light-emitting device in which the framework has a vertex at which the first straight portion, the second straight portion, and the curved portion are connected to each other.

The above-described light-emitting device of one embodiment of the present invention includes the framework including the curved portion, the first straight portion, and the second straight portion, the flexible first light-emitting panel supported by the curved portion and the first straight portion so as to form the first developable surface, and the flexible second light-emitting panel supported by the curved portion and the second straight portion so as to form the second developable surface.

Thus, a three-dimensional body including the first developable surface of the first light-emitting panel, the second developable surface of the second light-emitting panel, and a curved ridgeline provided between the first developable surface and the second developable surface can be formed. Consequently, a novel light-emitting device that is highly convenient or reliable can be provided.

Another embodiment of the present invention is the above-described light-emitting device in which one side of the second light-emitting panel that is supported by the curved portion can overlap with one side of the first light-emitting panel that is supported by the curved portion.

Thus, the curved portion can support the first light-emitting panel and the second light-emitting panel so that a gap between one side of the first light-emitting panel and one side of the second light-emitting panel is small. Consequently, a novel light-emitting device that is highly convenient or reliable can be provided.

Another embodiment of the present invention is any one of the above-described light-emitting devices in each of which the first light-emitting panel includes a region bent along the external shape of the first straight portion between the first light-emitting element and the first terminal portion.

Thus, the first terminal portion can be tucked in along the external shape of the first straight portion. Consequently, a novel light-emitting device that is highly convenient or reliable can be provided.

Another embodiment of the present invention is any one of the above-described light-emitting devices in each of which a region where a curved portion overlaps with the first light-emitting panel is included, and the first light-emitting panel emits light to a side on which the curved portion is not provided.

Thus, the first light-emitting panel can emit light without being blocked by the curved portion. Consequently, a novel light-emitting device that is highly convenient or reliable can be provided.

Another embodiment of the present invention is a light-emitting device including a framework, a flexible first light-emitting panel supported by the framework, and a flexible second light-emitting panel supported by the framework.

The framework includes a first curved portion supporting the first light-emitting panel, a first straight portion supporting the first light-emitting panel so that a first developable surface is formed between the first curved portion and the first straight portion, a second straight portion opposite to the first straight portion, and a second curved portion supporting the second light-emitting panel so that a second developable surface is formed between the second straight portion and the second curved portion.

The first light-emitting panel includes a first light-emitting element, a first terminal portion electrically connected to the first light-emitting element, and a region bent along the external shape of the first straight portion between the first light-emitting element and the first terminal portion.

The second light-emitting panel includes a second light-emitting element, a second terminal portion electrically connected to the second light-emitting element, and a region bent along the external shape of the second straight portion between the second light-emitting element and the second terminal portion.

The above-described light-emitting device of one embodiment of the present invention includes the framework including the first curved portion, the first straight portion, and the second straight portion; the flexible first light-emitting panel supported by the framework so as to form the first developable surface; and the flexible second light-emitting panel supported by the second straight portion opposite to the first straight portion so as to form the second developable surface. The first terminal portion included in the first light-emitting panel and the second terminal portion included in the second light-emitting panel are tucked in along the external shapes of the first straight portion and the second straight portion, respectively.

Thus, a three-dimensional body including the curved first developable surface of the first light-emitting panel and the second developable surface of the second light-emitting panel and supported by the second straight portion opposite to the first straight portion supporting the first light-emitting panel can be formed. Furthermore, the first terminal portion of the first light-emitting panel and the second terminal portion of the second light-emitting panel can be extracted from between the first straight portion and the second straight portion. Consequently, a novel light-emitting device that is highly convenient or reliable can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to one embodiment of the present invention, a novel light-emitting device that is highly convenient or reliable can be provided. Alternatively, a novel display device that is highly convenient or reliable can be provided. Alternatively, a novel input/output device that is highly convenient or reliable can be provided. Alternatively, a novel light-emitting device, a novel display device, a novel input/output device, or a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 3A, 3B, 3C1, and 3C2 illustrate a structure of a light-emitting device of one embodiment;

FIGS. 12A1, 12A2, 12B1, 12B2, 12C, 12D1, 12D2, 12E1, and 12E2 are schematic views illustrating a process for manufacturing a stack of one embodiment;

FIGS. 13A1, 13A2, 13B1, 13B2, 13C, 13D1, 13D2, 13E1, and 13E2 are schematic views illustrating a process for manufacturing a stack of one embodiment;

FIGS. 14A1, 14A2, 14B, 14C, 14D1, 14D2, 14E1, and 14E2 are schematic views illustrating a process for manufacturing a stack of one embodiment;

FIGS. 15A1, 15A2, 15B1, 15B2, 15C1, 15C2, 15D1, and 15D2 are schematic views illustrating processes for manufacturing stacks each having an opening portion in a support of one embodiment; and FIGS. 16A1, 16A2, 16B1, and 16B2 are schematic views illustrating structures of processed members of one embodiment.

BEST MODE FOR CARRYING OUT THE INVENTION

Figure 1A:
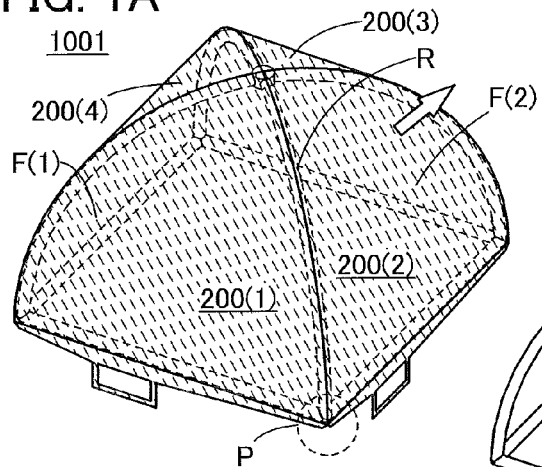
FIGS. 1A to 1D illustrate a structure of a light-emitting device of one embodiment.

A light-emitting device of one embodiment of the present invention includes a framework, a flexible first light-emitting panel supported by the framework so as to form a first developable surface, and a flexible second light-emitting panel supported by the framework so as to form a second developable surface.

Thus, a three-dimensional body including the first developable surface of the first light-emitting panel, the second developable surface of the second light-emitting panel, and a curved ridgeline provided between the first developable surface and the second developable surface can be formed. Consequently, a novel light-emitting device that is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of a light-emitting device of one embodiment of the present invention is described with reference to FIGS. 1A to 1D and FIGS. 2A and 2B.

FIGS. 1A to 1D illustrate a structure of a light-emitting device 1001 of one embodiment of the present invention.

Figure 1B:
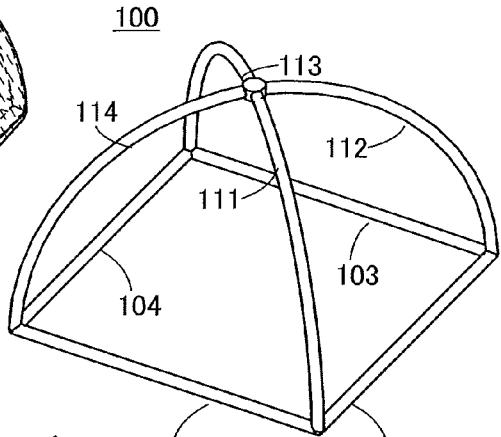
Figure 1C:
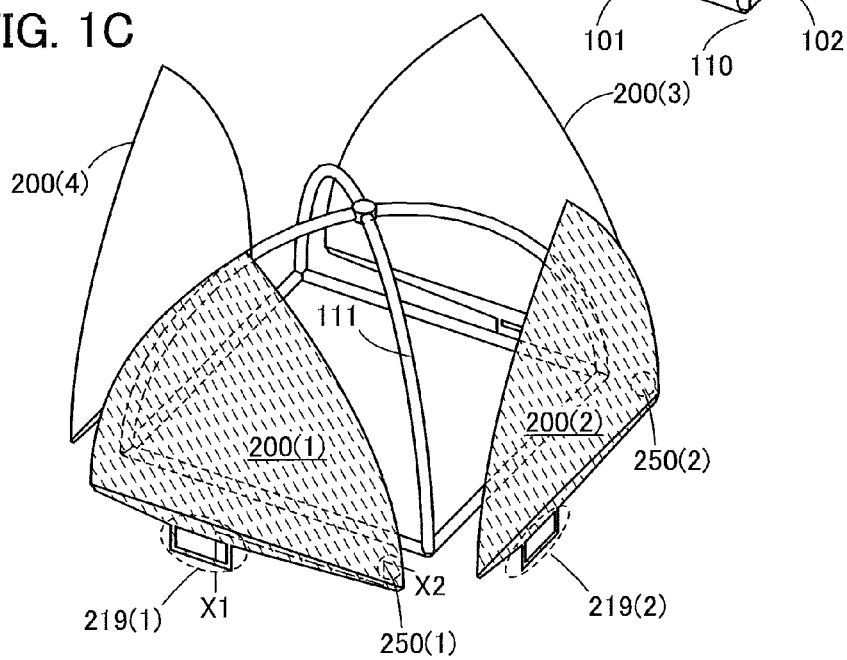
Figure 1D:
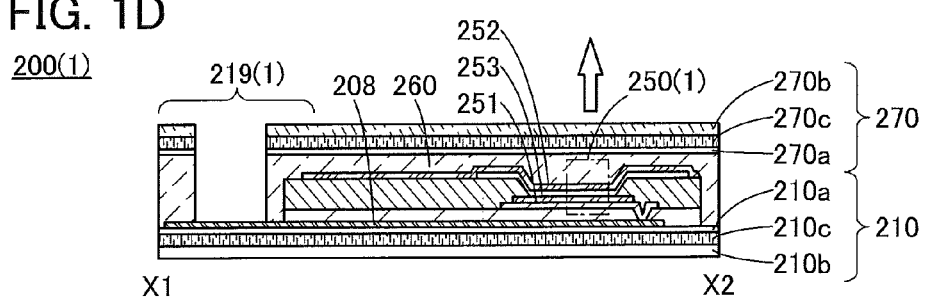

FIG. 1A is a projection view of the light-emitting device 1001 of one embodiment of the present invention, FIG. 1B is a projection view of a framework that can be used in the light-emitting device 1001, and FIG. 1C is an assembly drawing illustrating a structure of the light-emitting device 1001. FIG. 1D is a cross-sectional view illustrating a structure of a cross section taken along line X1-X2 of a light-emitting panel 200(1) in FIG. 1C.

<Structural Example 1 of Light-Emitting Device>

The light-emitting device 1001 described in this embodiment includes a framework 100, the flexible first light-emitting panel 200(1) supported by the framework 100, and a flexible second light-emitting panel 200(2) supported by the framework 100 (see FIG. 1A).

The framework 100 includes a curved portion 111 supporting the first light-emitting panel 200(1) and the second light-emitting panel 200(2), a first straight portion 101 supporting the first light-emitting panel 200(1) so that a first developable surface F(1) is formed between the curved portion 111 and the first straight portion 101, and a second straight portion 102 supporting the second light-emitting panel 200(2) so that a second developable surface F(2) is formed between the curved portion 111 and the second straight portion 102 (see FIG. 1B).

The first light-emitting panel 200(1) includes a first light-emitting element 250(1) and a first terminal portion 219(1) electrically connected to the first light-emitting element 250(1) (see FIGS. 1C and 1D).

The second light-emitting panel 200(2) includes a second light-emitting element 250(2) and a second terminal portion 219(2) electrically connected to the second light-emitting element 250(2).

The light-emitting device 1001 described in this embodiment includes the framework 100, the flexible first light-emitting panel 200(1) supported by the framework 100 so as to form the first developable surface F(1), and the flexible second light-emitting panel 200(2) supported by the framework 100 so as to form the second developable surface F(2).

Thus, a three-dimensional body including the first developable surface of the first light-emitting panel, the second developable surface of the second light-emitting panel, and a curved ridgeline provided between the first developable surface and the second developable surface can be formed. Consequently, a novel light-emitting device that is highly convenient or reliable can be provided.

A curved surface obtained by transforming a plane without expansion and contraction is referred to as a developable surface. The developable surface can be transformed to a plane without expansion and contraction. Furthermore, at least one straight line passing through a certain point on the developable surface can be lined on the developable surface.

Figure 2A:
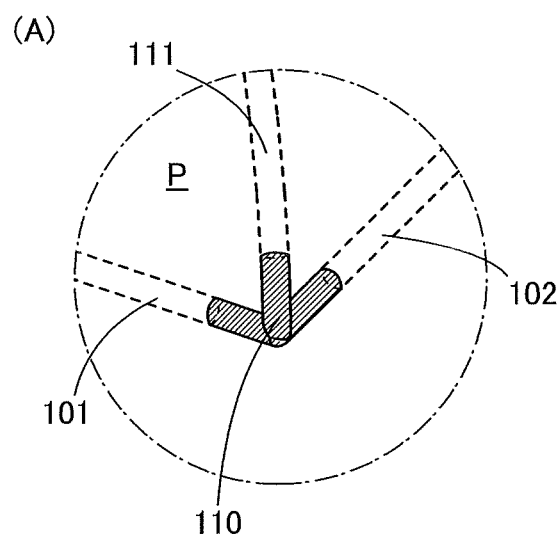
FIGS. 2A and 2B illustrate a structure of a light-emitting device of one embodiment.
Figure 2B:
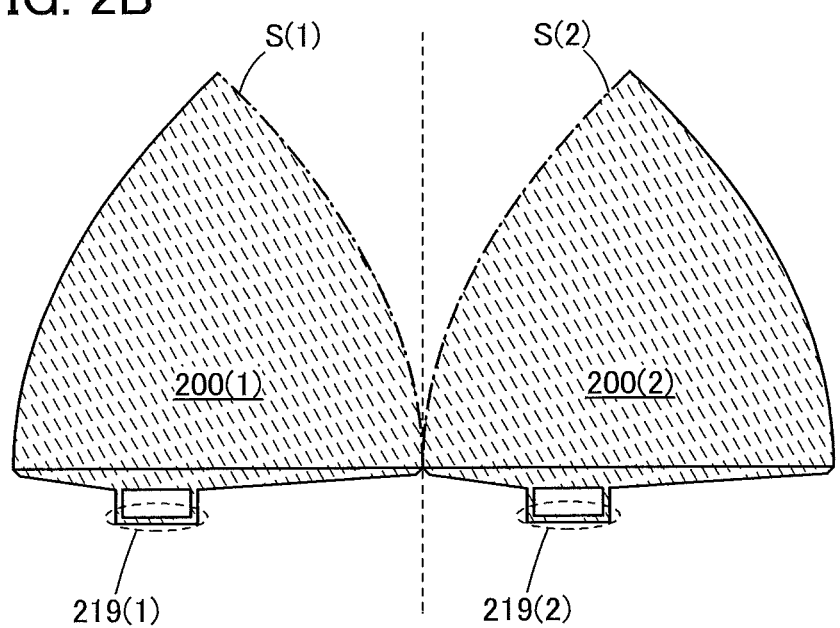

In the light-emitting device 1001, a side S(2) of the second light-emitting panel 200(2) that is supported by the curved portion 111 can overlap with part of a side S(1) of the first light-emitting panel 200(1) that is supported by the curved portion 111 (see FIG. 2B).

Thus, the curved portion can support the first light-emitting panel and the second light-emitting panel so that a gap between one side of the first light-emitting panel and one side of the second light-emitting panel is small. Consequently, a novel light-emitting device that is highly convenient or reliable can be provided.

Furthermore, the first light-emitting panel 200(1) may include a base 210, a base 270, and the light-emitting element 250(1) provided between the base 210 and the base 270 (see FIG. 1D).

In addition, a sealant 260 for bonding the base 210 and the base 270 may be provided.

The base 210 may include a barrier film 210*a*, a base 210*b*, and a resin layer 210*c* between the barrier film 210*a* and the base 210*b*. The base 270 may include a barrier film 270*a*, a base 270*b*, and a resin layer 270*c* between the barrier film 270*a* and the base 270*b*.

The light-emitting element 250(1) may include a lower electrode 251, an upper electrode 252, and a layer 253 containing a light-emitting organic compound between the lower electrode 251 and the upper electrode 252.

In addition, a first terminal portion 219(1) and a conductive layer 208 that electrically connects the first terminal portion 219(1) and the light-emitting element 250(1) may be provided.

Furthermore, a third light-emitting panel 200(3) and a fourth light-emitting panel 200(4) may be provided.

Components of the light-emitting device 1001 are described below. Note that these components cannot be clearly distinguished and one component also serves as another component or includes part of another component in some cases.

<<Overall Structure>>

The light-emitting device 1001 of one embodiment of the present invention includes the framework 100, the first light-emitting panel 200(1), and the second light-emitting panel 200(2).

<<Framework>>

The framework 100 includes the first straight portion 101, the second straight portion 102, and the curved portion 111 (see FIG. 1B). Note that the framework can also be referred to as a frame, a pattern, a wire frame, or a reinforcing member.

The edge portions of the first straight portion 101, the second straight portion 102, and the curved portion 111 may be connected to each other to form a vertex P (see FIG. 1A or FIG. 2A).

In addition, a curved portion 112, a curved portion 113, and a curved portion 114 may be included, and a third straight portion 103 and a fourth straight portion 104 may be included (see FIG. 1B).

The curved portion 111 and the curved portion 113 can have a shape along one arc. In addition, the curved portion 112 and the curved portion 114 can have a shape along the other arc.

Furthermore, the other arc may be orthogonal to the one arc at the vertex, so that the first straight portion 101, the second straight portion 102, the third straight portion 103, and the fourth straight portion 104 can be placed to form a square or a lozenge.

Alternatively, the one arc may intersect with the other arc at the vertex so that the first straight portion 101, the second straight portion 102, the third straight portion 103, and the fourth straight portion 104 form a rectangle.

A straight line parallel to the first straight portion 101 can be moved along the first developable surface F(1). The first straight portion 101 is in contact with the first developable surface F(1) on one tangent included in the surface of the first straight portion 101.

A straight line parallel to the second straight portion 102 can be moved along the second developable surface F(2). The second straight portion 102 is in contact with the second developable surface F(2) on one tangent included in the surface of the second straight portion 102.

The curved portion 111 is in contact with the first developable surface F(1) at one curve included in the surface of the curved portion 111, and is in contact with the second developable surface F(2) at the one curve or another curve.

The first light-emitting panel 200(1) or the second light-emitting panel 200(2) is in contact with the curved portion 111 at a curve with a radius of curvature of 4 mm or greater, preferably 2 mm or greater, further preferably 1 mm or greater.

For the first straight portion 101, the second straight portion 102, or the curved portion 111, a member having a rod shape such as a prismatic columnar shape, a member having a tubular shape such as a cylindrical shape, a member having a plate shape such as an I shape, an L shape, or a V shape, or the like can be used, for example. Although the framework 100 supports a side of the light-emitting panel 200(1), the framework 100 can support a plane of the light-emitting panel 200(1). A framework having an opening portion is more lightweight than a framework that does not have an opening portion.

For example, for the framework 100, an organic material, an inorganic material, a composite material of an organic material and an inorganic material, or a stacked-layer material can be used. Specifically, a resin, a metal, a metal coated with a resin, a resin into which a glass fiber or a carbon fiber is dispersed, or the like can be used. Furthermore, a natural material such as wood, paper, or the like can be used.

Note that a splicer 110 that can connect the first straight portion 101, the second straight portion 102, and the curved portion 111 may be used (see FIG. 2A).

For example, the splicer 110 may fit with and connect the first straight portion 101, the second straight portion 102, and the curved portion 111.

Specifically, the first straight portion 101, the second straight portion 102, and the curved portion 111 whose end portions each have a portion thinner than the other portion in the external shape, and the splicer 110 including a sheath-shaped space that can fit with the thinner portions can be used.

<<Light-Emitting Panel>>

The first light-emitting panel 200(1) can include the first light-emitting element 250(1), the first terminal portion 219(1), and the flexible base 210.

A structure similar to that of the first light-emitting panel 200(1) can be used in any of the second light-emitting panel 200(2), the third light-emitting panel 200(3), and the fourth light-emitting panel 200(4).

When the side S(2) of the second light-emitting panel 200(2) that is supported by the curved portion 111 overlaps with part of the side S(1) of the first light-emitting panel 200(1) that is supported by the curved portion 111, the second light-emitting panel 200(2) can be placed close to the first light-emitting panel 200(1), for example, without any space, in the curved portion 111.

Specifically, when the second light-emitting panel 200(2) and the first light-emitting panel 200(1) face each other, the side S(2) represented by a dashed-dotted line can overlap with the side S(1) represented by a dashed-dotted line. In other words, the side S(2) of the second light-emitting panel 200(2) that is represented by a dashed-dotted line is linearly symmetrical with the side S(1) of the first light-emitting panel 200(1) that is represented by a dashed-dotted line.

When the side S(2) represented by a dashed-dotted line is linearly symmetrical with the side S(1) represented by a dashed-dotted line and the side S(2) is placed along the side S(1), the second light-emitting panel 200(2) can be close to the first light-emitting panel 200(1). For example, the second light-emitting panel 200(2) and the first light-emitting panel 200(1) can form a ridgeline.

Furthermore, the first light-emitting panel 200(1) to the fourth light-emitting panel 200(4) each emit light to at least one side. For example, each of the first light-emitting panel 200(1) to the fourth light-emitting panel 200(4) included in the light-emitting device 1001 may emit light to the convex side of the formed developable surface. Note that in the drawing, a direction in which the second light-emitting panel 200(2) emits light is denoted by an arrow (see FIG. 1A).

Note that a curved surface formed by the first light-emitting panel or the second light-emitting panel has a radius of curvature of 4 mm or greater, preferably 2 mm or greater, further preferably 1 mm or greater.

The external shape of the light-emitting panel 200(1) is not particularly limited. For example, a substantially triangular external shape including two curved sides that intersect with each other at one corner and a linear side opposite to the one corner, in other words, the external shape of a boat, can be used as the external shape of the light-emitting panel. Furthermore, the terminal portion 219(1) is provided on the linear side.

<<Light-Emitting Element>>

A variety of light-emitting elements can be used as the first light-emitting element 250(1). For example, a light-emitting element using organic electroluminescence or inorganic electroluminescence, a light-emitting diode, or the like can be used.

Specifically, a light-emitting element (also referred to as an organic EL element) including the lower electrode 251, the upper electrode 252 overlapping the lower electrode 251, and the layer 253 containing a light-emitting organic compound between the lower electrode 251 and the upper electrode 252 can be used as the first light-emitting element 250(1) (see FIG. 1D).

Note that the first light-emitting panel 200(1) may emit light to the upper electrode 252 side and/or to the lower electrode 251 side. An example in which the first light-emitting panel 200(1) emits light to the upper electrode 252 side is shown by an arrow in the drawing (see FIG. 1D).

<<Conductive Layer and Terminal Portion>>

The conductive layer 208 is electrically connected to the light-emitting element 250(1).

To the terminal portion 219(1), a signal, power, or the like is supplied. Part of the conductive layer 208 is provided in the terminal portion 219(1). For example, part of the conductive layer 208 may be exposed to part of the terminal portion 219(1) so that a flexible printed circuit and the terminal portion 219(1) can be electrically connected to each other.

A conductive material can be used for the conductive layer 208.

Specifically, a metal element selected from aluminum, gold, platinum, silver, copper, chromium, tantalum, titanium, molybdenum, tungsten, nickel, iron, cobalt, palladium, and manganese, or the like can be used. Alternatively, an alloy including any of the above-described metal elements, or the like can be used. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, an alloy film or a nitride film in which aluminum and one or more elements selected from titanium, tantalum, tungsten, molybdenum, chromium, neodymium, and scandium are combined may be used.

Alternatively, a conductive material containing a conductive metal oxide or the like may be used. Specifically, indium oxide, tin oxide, zinc oxide, or the like may be used.

<<Base>>

As a material of the base 210, an organic material, an inorganic material, or a composite material of an organic material and an inorganic material can be used. The material that can be used for the base 210 can be used for the base 270.

The base 210 can be formed using a material with a thickness in the range from 5 μm to 2500 μm, preferably from 5 μm to 680 μm, more preferably from 5 μm to 170 μm, more preferably from 5 μm to 45 μm, more preferably from 8 μm to 25 μm.

In addition, a material with which passage of impurities is inhibited can be favorably used for the base 210. For example, a material with a vapor permeability of lower than or equal to $10^{-5}$ g/(m$^2$·day), preferably lower than or equal to $10^{-6}$ g/(m$^2$·day) can be favorably used.

In the case where a stacked-layer material of a plurality of materials is used for the base 210, materials whose coefficients of linear expansion are substantially equal to each other can be favorably used. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Examples of the material of the base 210 are organic materials such as a resin, a resin film, and a plastic film.

Examples of the material of the base 210 are inorganic materials such as a metal plate and a thin glass plate with a thickness of greater than or equal to 10 μm and less than or equal to 50 μm.

Examples of the material of the base 210 are composite materials such as resin films to which a metal plate, a thin glass plate, or a film of an inorganic material is attached using a resin layer.

Examples of the material of the base 210 are composite materials such as a resin or a resin film into which a fibrous or particulate metal, glass, or inorganic material is dispersed.

For example, a thermosetting resin or an ultraviolet curable resin can be used for a resin layer.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, silicon oxide, silicon nitride, silicon oxynitride, an alumina film, or the like can be used.

Alternatively, SUS, aluminum, or the like provided with an opening can be used.

Alternatively, a resin such as an acrylic resin, a urethane resin, an epoxy resin, or a resin having a siloxane bond can be used.

For example, a stack in which a flexible base 210b, a barrier film 210a that prevents diffusion of impurities, and a resin layer 210c that bonds the barrier film 210a to the base 210b are stacked can be favorably used for the base 210 (see FIG. 1D).

A film including a stacked material in which a 600-nm-thick silicon oxynitride film and a 200-nm-thick silicon nitride film are stacked can be specifically used as the barrier film 210a.

Specifically, a film including a stacked material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the barrier film 210a.

Specifically, a resin film, resin plate, or a stack of polyester, polyolefin, polyamide, polyimide, polycarbonate, an acrylic resin, or the like can be used as the base 210b.

Specifically, a material that includes polyester, polyolefin, polyamide (e.g., nylon or aramid); polyimide, polycarbonate, an acrylic resin, a urethane resin, an epoxy resin, or a resin having a siloxane bond can be used for the resin layer 210c.

<Structural Example 2 of Light-Emitting Device<

Another structure of the light-emitting device of one embodiment of the present invention is described with reference to FIGS. 3A, 3B, 3C1, and 3C2.

FIGS. 3A, 3B, 3C1, and 3C2 illustrate a structure of a light-emitting device 1001B of one embodiment of the present invention.

Figure 3A:
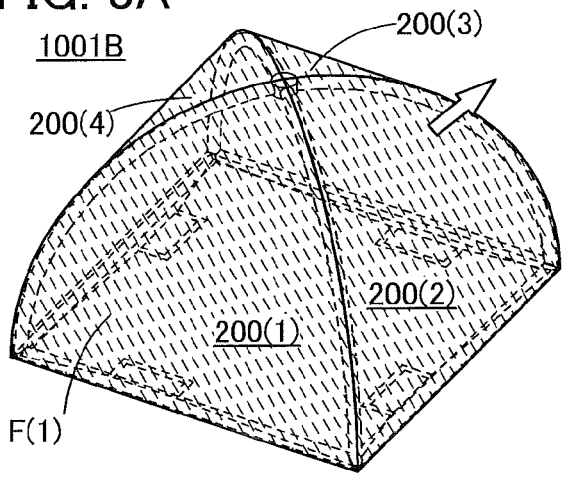
Figure 3B:
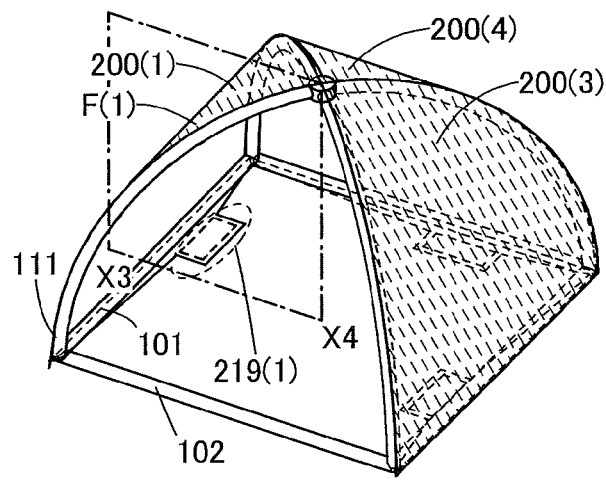
Figure 3B:
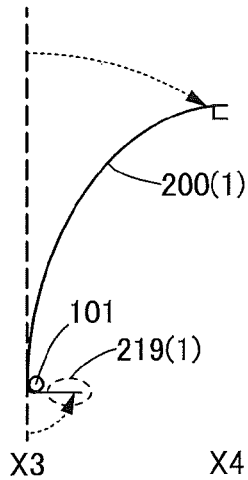
Figure 3B:
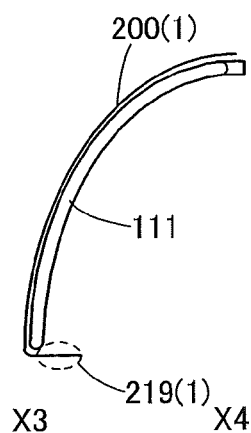

FIG. 3A is a projection view of the light-emitting device 1001B of one embodiment of the present invention, and FIG. 3B is a projection view of the light-emitting device 1001B in FIG. 3A that is rotated clockwise by 90° and in which some components are not illustrated. FIG. 3C1 is a side view illustrating a structure of a cross section taken along line X3-X4 and an internal structure of the light-emitting device 1001B in FIG. 3A, and FIG. 3C2 is a side view of the light-emitting device 1001B in which some components are not illustrated.

In the light-emitting device 1001B described in this embodiment, the first light-emitting panel 200(1) includes a region bent along the external shape of the first straight portion 101 between the first light-emitting element and the first terminal portion 219(1) (see FIGS. 3A, 3B, 3C1, and 3C2).

Thus, the first terminal portion can be tucked in along the external shape of the first straight portion. Consequently, a novel light-emitting device that is highly convenient or reliable can be provided.

Note that a direction in which the second light-emitting panel 200(2) emits light is denoted by an arrow in the drawing (see FIG. 3A).

The light-emitting device 1001B is different from the light-emitting device 1001 described with reference to FIGS. 1A to 1D in that the first terminal portion 219(1) is placed to be tucked in along the external shape of the first straight portion 101 (see FIG. 1A and FIG. 3B). Different components will be described in detail below, and the above description is referred to for the other similar components.

<<Overall Structure>>

The light-emitting device 1001B of one embodiment of the present invention includes the framework 100, the first light-emitting panel 200(1), and the second light-emitting panel 200(2).

<<First Terminal Portion>>

The first terminal portion 219(1) has flexibility.

For example, part of the flexible base 210 may support the first terminal portion 219(1).

The flexible first terminal portion 219(1) can be tucked in along the external shape of the first straight portion 101.

<<Framework>>

The first straight portion 101 has an external shape along which the first terminal portion 219(1) can be tucked in without being damaged.

For example, a curved surface with curvature with which the first terminal portion 219(1) can be tucked in along the curved surface without being damaged is provided.

Specifically, a material whose cross-sectional shape is circular can be used for the first straight portion 101 (see FIG. 3C1).

Note that a curved surface in contact with the first light-emitting panel or the second light-emitting panel has a radius of curvature of 4 mm or greater, preferably 2 mm or greater, further preferably 1 mm or greater.

<Structural Example 3 of Light-Emitting Device>

Another structure of the light-emitting device of one embodiment of the present invention is described with reference to FIGS. 4A and 4B.

Figure 4A:
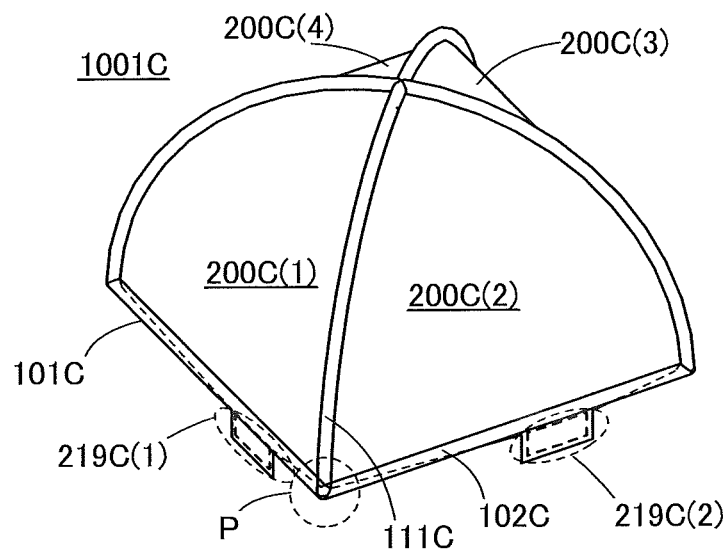
FIGS. 4A and 4B illustrate a structure of a light-emitting device of one embodiment.
Figure 4B:
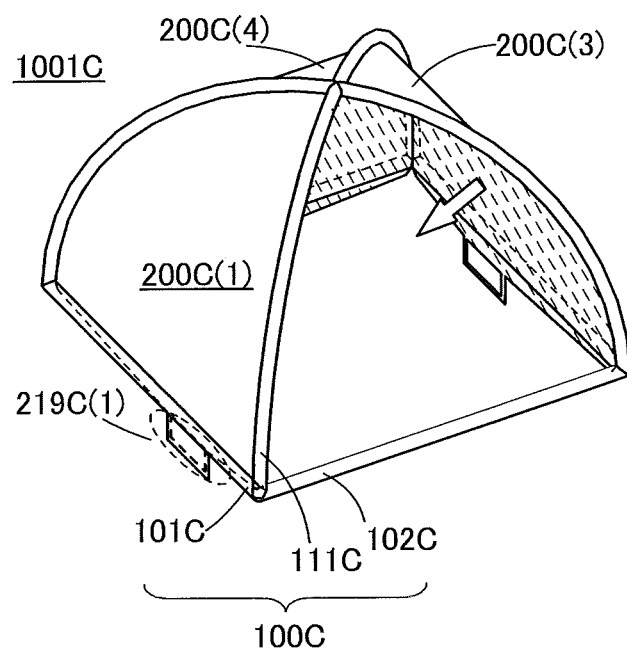

FIGS. 4A and 4B illustrate a structure of a light-emitting device 1001C of one embodiment of the present invention.

FIG. 4A is a projection view of the light-emitting device 1001C of one embodiment of the present invention, and FIG. 4B is a projection view of the light-emitting device 1001C in which some components are not illustrated.

In the light-emitting device 1001C described in this embodiment, a region where a curved portion 111C overlaps with a first light-emitting panel 200C(1) is included, and the first light-emitting panel 200C(1) emits light to a side on which the curved portion 111C is not provided (see FIGS. 4A and 4B). The first light-emitting panel 200C(1) includes a first terminal portion 219C(1).

Thus, the first light-emitting panel can emit light without being blocked by the curved portion. Consequently, a novel light-emitting device that is highly convenient or reliable can be provided.

The light-emitting device 1001C is different from the light-emitting device 1001 described with reference to FIGS. 1A to 1D in that the first light-emitting panel 200C(1) to the fourth light-emitting panel 200C(4) are provided so that concave developable surfaces are formed and the concave developable surfaces emit light (see FIG. 1A). Different components will be described in detail below, and the above description is referred to for the other similar components.

<<Framework>>

A framework 100C includes a first straight portion 101C, a second straight portion 102C, and the curved portion 111C (see FIG. 4B).

The edge portions of the first straight portion 101C, the second straight portion 102C, and the curved portion 111C may be connected to each other to four a vertex P (see FIG. 4A).

<<Light-Emitting Panel>>

The light-emitting panel 200C(1) and a light-emitting panel 200C(2) are provided on the concave-curved side, of the curved portion 111C.

Furthermore, the first light-emitting panel 200C(1) to the fourth light-emitting panel 200C(4) are provided so that concave developable surfaces are formed and light is emitted to the side on which the concave developable surfaces are formed.

Note that a direction in which a third light-emitting panel 200C(3) emits light is denoted by an arrow in the drawing (see FIG. 4B).

This embodiment can be combined with any of the other embodiments in this specification as appropriate.

Embodiment 2

In this embodiment, a structure of a display device of one embodiment of the present invention is described with reference to FIGS. 5A to 5D.

FIGS. 5A to 5D illustrate a structure of a light-emitting device 1001D of one embodiment of the present invention.

Figure 5A:
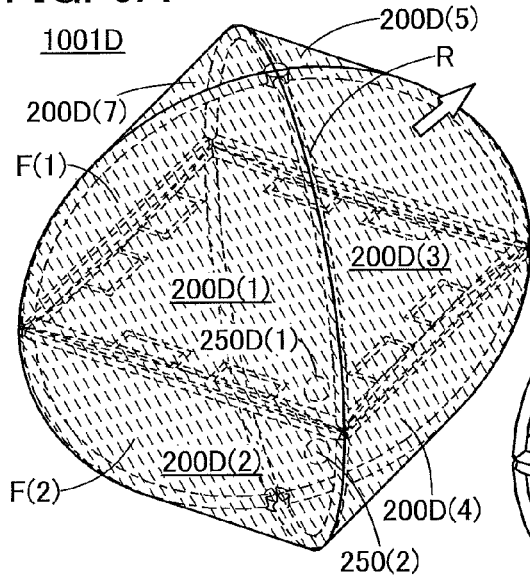
FIGS. 5A to 5D illustrate a structure of a light-emitting device of one embodiment.
Figure 5B:
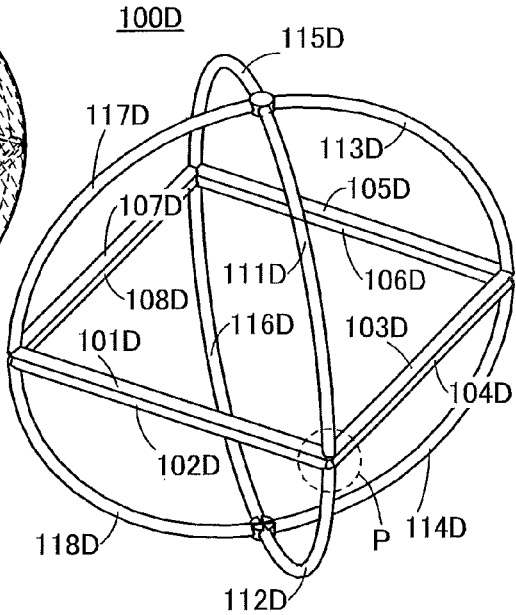
Figure 5C:
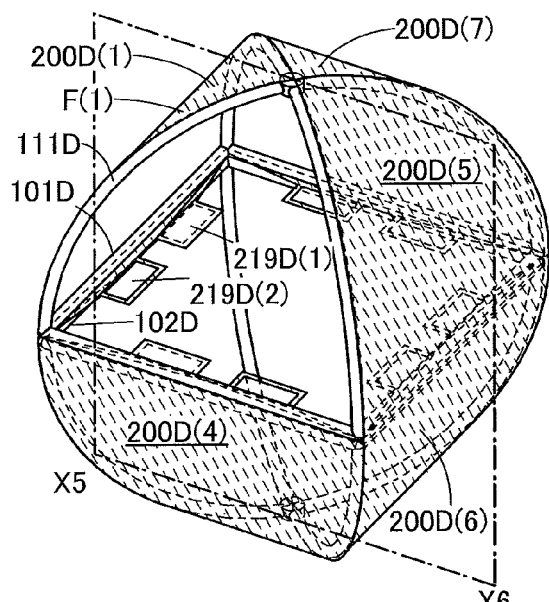
Figure 5D:
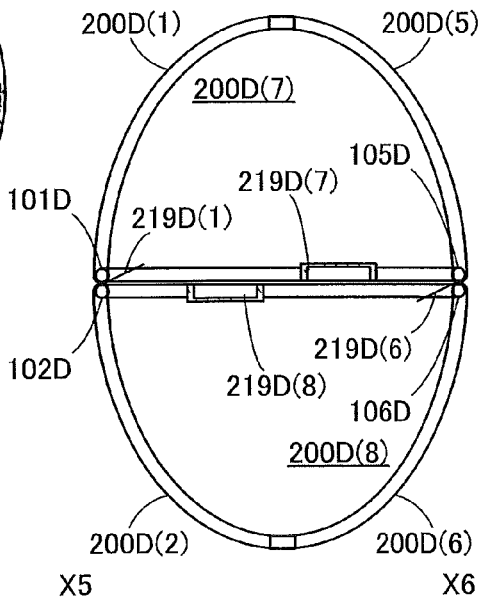

FIG. 5A is a projection view of the light-emitting device 1001D of one embodiment of the present invention, FIG. 5B is a projection view of a framework 100D that can be used in the light-emitting device 1001D in FIG. 5A, and FIG. 5C is a projection view of the light-emitting device 1001D in FIG. 5A that is rotated clockwise by 90° and in which some components are not illustrated. FIG. 5D is a side view illustrating a structure of a cross section taken along line X5-X6 and an internal structure of the light-emitting device 1001D in FIG. 5A.

<Structural Example 4 of Light-Emitting Device>

The light-emitting device 1001D described in this embodiment includes the framework 100D, a flexible first light-emitting panel 200D(1) supported by the framework 100D, and a flexible second light-emitting panel 200D(2) supported by the framework 100D (see FIGS. 5A and 5B).

The framework 100D includes a first curved portion 111D supporting the first light-emitting panel 200D(1), a first straight portion 101D supporting the first light-emitting panel 200D(1) so that the first developable surface F(1) is formed between the first curved portion 111D and the first straight portion 101D, a second straight portion 102D opposite to the first straight portion 101D, and a second curved portion 112D supporting the second light-emitting panel 200D(2) so that the second developable surface F(2) is formed between the second straight portion 102D and the second curved portion 112D.

The first light-emitting panel 200D(1) includes a first light-emitting element 250D(1), a first terminal portion 219D(1) electrically connected to the first light-emitting element 250D(1), and a region bent along the external shape of the first straight portion 101D between the first light-emitting element 250D(1) and the first terminal portion 219D(1) (see FIGS. 5A and 5C).

The second light-emitting panel 200D(2) includes a second light-emitting element 250D(2), a second terminal portion 219D(2) electrically connected to the second light-emitting element 250D(2), and a region bent along the external shape of the second straight portion 102D between the second light-emitting element 250D(2) and the second terminal portion 219D(2) (see FIG. 5C).

The light-emitting device 1001D of one embodiment of the present invention includes the framework 100D including the first curved portion 111D, the first straight portion 101D, and the second straight portion 102D; the flexible first light-emitting panel 200D(1) supported by the framework 100D so as to form the first developable surface F(1); and the flexible second light-emitting panel 200D(2) supported by the second straight portion 102D opposite to the first straight portion 101D so as to form the second developable surface F(2). The first terminal portion 219D(1) included in the first light-emitting panel 200D(1) and the second terminal portion 219D(2) included in the second light-emitting panel 200D(2) are tucked in along the external shapes of the first straight portion 101D and the second straight portion 102D, respectively.

Thus, a three-dimensional body including the curved first developable surface of the first light-emitting panel and the second developable surface of the second light-emitting panel that is supported by the second straight portion opposite to the first straight portion supporting the first light-emitting panel can be formed. Furthermore, the first terminal portion of the first light-emitting panel and the second terminal portion of the second light-emitting panel can be extracted from between the first straight portion and the second straight portion. Consequently, a novel light-emitting device that is highly convenient or reliable can be provided.

In addition, a third light-emitting panel 200D(3) to an eighth light-emitting panel 200D(8) may be provided.

Components of the light-emitting device 1001D are described below. Note that these components cannot be clearly distinguished and one component also serves as another component or includes part of another component in some cases.

The light-emitting device 1001D is different from the light-emitting device 1001B described with reference to FIGS. 3A, 3B, 3C1, and 3C2 in that the framework 100D includes the second straight portion 102D opposite to the first straight portion 101D, the second light-emitting panel 200D(2) is not supported by the curved portion 111, and the first terminal portion 219D(1) and the second terminal portion 219D(2) are tucked in along the external shapes of the first straight portion 101D and the second straight portion 102D, respectively (see FIG. 3B). Here, different components will be described in detail, and the description in Embodiment 1 is referred to for the other similar components.

<<Overall Structure>>

The light-emitting device 1001D of one embodiment of the present invention includes the framework 100D, the first light-emitting panel 200D(1), and the second light-emitting panel 200D(2).

<<Framework>>

The framework 100D includes the first straight portion 101D, the second straight portion 102D, and the curved portion 111D (see FIG. 5B).

Note that the framework 100D exemplified in this embodiment has a shape in which the straight portions of the two frameworks 100 exemplified in Embodiment 1 are arranged to be opposite to each other.

The framework 100D can provide a variety of three-dimensional bodies including polygonal cross sections and cross sections with arcs.

The edge portions of the first straight portion 101D, the second straight portion 102D, and the curved portion 111D may be connected to each other to form a vertex P.

In addition, a third straight portion 103D to an eighth straight portion 108D may be provided.

In addition, the second curved portion 112D to an eighth curved portion 118D may be provided.

The curved portion 111D, the curved portion 112D, the curved portion 116D, and the curved portion 115D can have a shape along one arc. In addition, the curved portion 113D, the curved portion 114D, the curved portion 118D, and the curved portion 117D can have a shape along the other arc.

Furthermore, the other arc may be orthogonal to the one arc at the vertex, so that the first straight portion 101D, the third straight portion 103D, the fifth straight portion 105D, and the seventh straight portion 107D can be placed to form a square or a lozenge and the second straight portion 102D, the fourth straight portion 104D, the sixth straight portion 106D, and the eighth straight portion 108D can be placed to form a square or a lozenge.

Alternatively, the one arc may intersect with the other arc at the vertex so that the first straight portion 101D, the third straight portion 103D, the fifth straight portion 105D, and the seventh straight portion 107D form a rectangle and the second straight portion 102D, the fourth straight portion 104D, the sixth straight portion 106D, and the eighth straight portion 108D form a rectangle.

The second straight portion 102D is opposite to the first straight portion 101D, and the first terminal portion 219D(1) and the second terminal portion 219D(2) can be placed between the first straight portion 101D and the second straight portion 102D.

<<Light-Emitting Panel>>

The first light-emitting panel 200D(1) is supported so as to form the developable surface F(1) between the curved portion 111D and the first straight portion 101D, and the first terminal portion 219D(1) is placed along the external shape of the first straight portion 101D (see FIG. 5C).

The first straight portion 101D is in contact with the first light-emitting panel 200D(1) on one tangent included in the surface of the first straight portion 101D.

The second light-emitting panel 200D(2) is supported so as to form the developable surface F(2) between the curved portion 112D and the second straight portion 102D, and the second terminal portion 219D(2) is placed along the external shape of the second straight portion 102D.

The second straight portion 102D is in contact with the second light-emitting panel 200D(2) on one tangent included in the surface of the second straight portion 102D.

In other words, the first terminal portion 219D(1) and the second terminal portion 219D(2) are placed between the first straight portion 101D and the second straight portion 102D and along the external shapes of the first straight portion 101D and the second straight portion 102D, respectively (see FIG. 5C).

Note that the tangent on which the second straight portion 102D is in contact with the second light-emitting panel 200D(2) is substantially parallel to the tangent on which the first straight portion 101D is in contact with the first light-emitting panel 200D(1).

In addition, the light-emitting device 1001D may include the third to eighth light-emitting panels 200D(3) to 200D(8).

For example, a structure similar to that of the light-emitting panel described in Embodiment 1 can be used in any of the first to eighth light-emitting panels 200D(1) to 200D(8).

Note that a direction in which the third light-emitting panel 200D(3) emits light is denoted by an arrow in the drawing (see FIG. 5A).

This embodiment can be combined with any of the other embodiments in this specification as appropriate.

Embodiment 3

In this embodiment, a structure of a display device of one embodiment of the present invention is described with reference to FIGS. 6A and 6B.

Figure 6A:
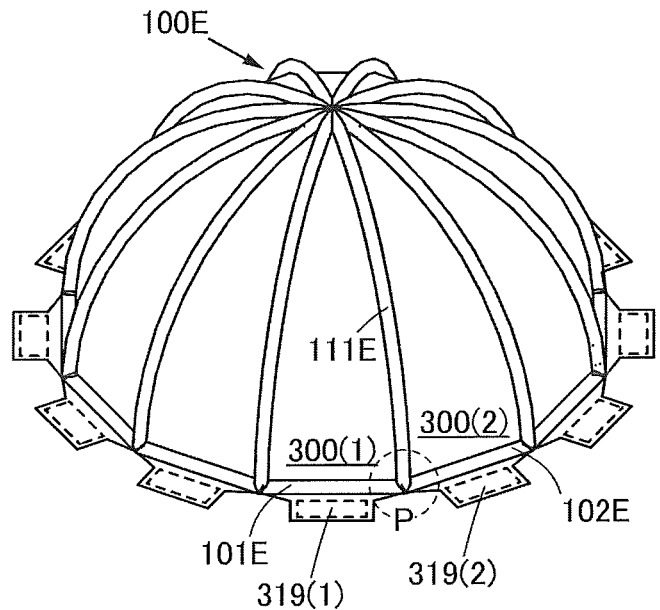
FIGS. 6A and 6B illustrate a structure of a display device of one embodiment.
Figure 6B:
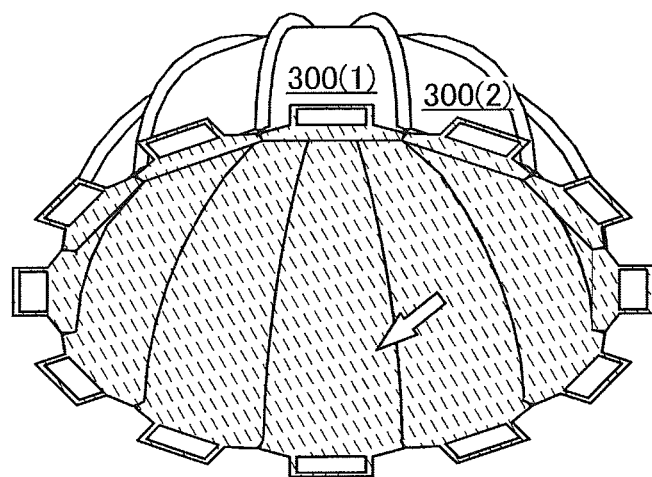

FIGS. 6A and 6B illustrate a structure of a display device 1002 of one embodiment of the present invention. FIG. 6A is a projection view of the display device 1002 of one embodiment of the present invention seen obliquely from above, and FIG. 6B is a projection view of the display device 1002 in FIG. 6A seen obliquely from below.

<Structural Example 1 of Display Device>

The display device 1002 described in this embodiment includes a framework 100E, a flexible first display panel 300(1) supported by the framework 100E, and a flexible second display panel 300(2) supported by the framework 100E (see FIG. 6A).

The framework 100E includes a curved portion 111E supporting the first display panel 300(1) and the second display panel 300(2), a first straight portion 101E supporting the first display panel 300(1) so that a first developable surface is formed between the curved portion 111E and the first straight portion 101E, and a second straight portion 102E supporting the second display panel 300(2) so that a second developable surface is formed between the curved portion 111E and the second straight portion 102E.

The first display panel 300(1) includes a first light-emitting element, a first terminal portion 319(1) electrically connected to the first light-emitting element, and a region bent along the external shape of the first straight portion 101E between the first light-emitting element and the first terminal portion 319(1).

The second display panel 300(2) includes a second light-emitting element, a second terminal portion 319(2) electrically connected to the second light-emitting element, and a region bent along the external shape of the second straight portion 102E between the second light-emitting element and the second terminal portion 319(2).

The display device 1002 described in this embodiment includes the framework 100E, the flexible first display panel 300(1) supported by the framework 100E so as to form the first developable surface, and the flexible second display panel 300(2) supported by the framework 100E so as to form the second developable surface.

Thus, a three-dimensional body including the first developable surface of the first display panel, the second developable surface of the second display panel, and a curved ridgeline between the first developable surface and the second developable surface can be formed. Consequently, a novel display device that is highly convenient or reliable can be provided. For example, such a display device can be used as a display device displaying a whole sky image and the like, a planetarium, or the like.

<<Overall Structure>>

The display device 1002 of one embodiment of the present invention includes the framework 100E, the first display panel 300(1), and the second display panel 300(2).

<<Framework>>

The framework 100E includes the curved portion 111E, the first straight portion 101E, and the second straight portion 102E.

The framework 100E may include twelve curved portions and twelve straight portions.

The framework 100E may include six pairs of curved portions including two curved portions having a shape along one arc.

Instead of the framework 100E, a framework including a support at a portion in which a plurality of curved portions intersects with each other can be used. For example, a framework like a frame of an umbrella, which includes a support extended to the concave-curved side of the curved portion. Furthermore, a driving device that drives the display panel 300(1) or a power source may be disposed on the support and a wiring may be disposed along the curved portion. The driving device or the power source and the terminal portion 319(1) of the display panel 300(1) may be electrically connected to the wiring. Thus, the display panel 300(1) can be operated by using the driving device or the power source disposed on the support.

<<Display Panel>>

The first display panel 300(1) has flexibility and includes the light-emitting element and the first terminal portion 319(1) electrically connected to the light-emitting element.

The second display panel 300(2) has flexibility and includes the light-emitting element and the second terminal portion 319(2) electrically connected to the light-emitting element.

The first terminal portion 319(1) is provided along the external shape of the first straight portion 101E, and the second terminal portion 319(2) is provided along the external shape of the second straight portion 102E.

First image data is supplied to the first terminal portion 319(1), and the first display panel 300(1) displays the first image data.

Second image data is supplied to the second terminal portion 319(2), and the second display panel 300(2) displays the second image data.

The first display panel 300(1) is supported by the framework 100E so that the first image data is displayed on a side on which the concave developable surface is formed (see FIG. 6B).

The second display panel 300(2) is supported by the framework 100E so that the second image data is displayed on a side on which the concave developable surface is formed.

Note that the first image data may be supplied to the first display panel 300(1) and the second image data associated with the first image data may be supplied to the second display panel 300(2) so that an image connecting with an image displayed on the first display panel 300(1) is displayed on the second developable surface of the second display panel 300(2) in a portion adjacent to the first developable surface of the first display panel 300(1), that is, in the curved portion 111E.

Thus, for example, continuous images can be displayed on a concave surface formed using a plurality of display panels so that the images are recognized as one image by a user.

Specifically, when the display device 1002 has a bowl size which is large enough to cover the face of the user of the display device 1002 or a dome size which is large enough to contain the user, an image giving the user a great sense of realism can be displayed.

Furthermore, an image can be displayed with a higher luminance than that displayed by a projector. In addition, an image with higher definition than that displayed by a projector can be displayed.

Specifically, the display device 1002 preferably has a diameter of 20 cm or greater, 1 m or greater, 2 m or greater, 5 m or greater, 10 m or greater, 20 m or greater, or 30 m or greater and 250 m or less.

Note that an example of a structure of a display panel that can be used as the first display panel 300(1) or the second display panel 300(2) will be described in detail in Embodiment 5.

This embodiment can be combined with any of the other embodiments in this specification as appropriate.

Embodiment 4

In this embodiment, a structure of an input/output device of one embodiment of the present invention is described with reference to FIGS. 7A to 7D.

FIGS. 7A to 7D illustrate a structure of an input/output device 1003 of one embodiment of the present invention.

Figure 7A:
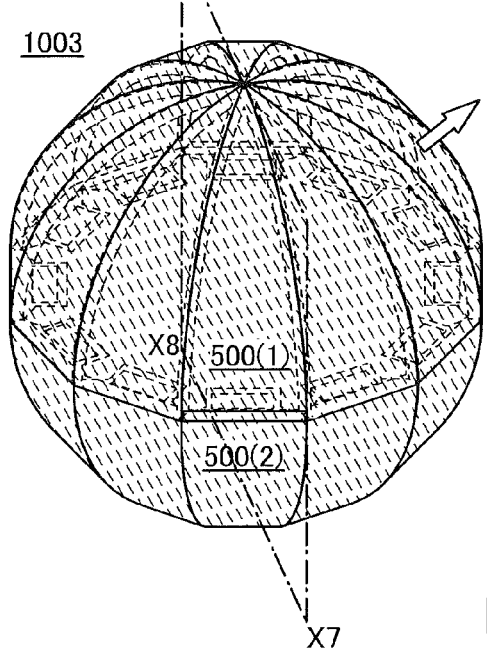
FIGS. 7A to 7D illustrate a structure of an input/output device of one embodiment.
Figure 7B:
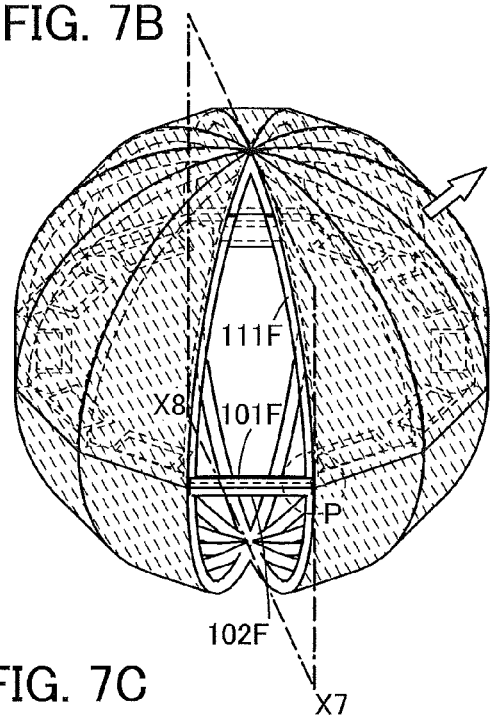
Figure 7C:
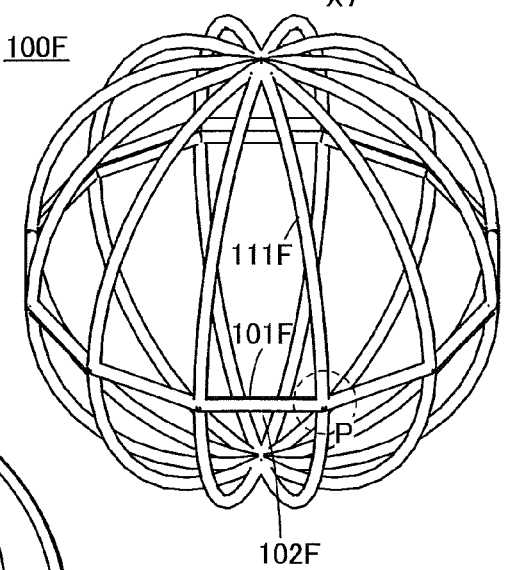
Figure 7D:
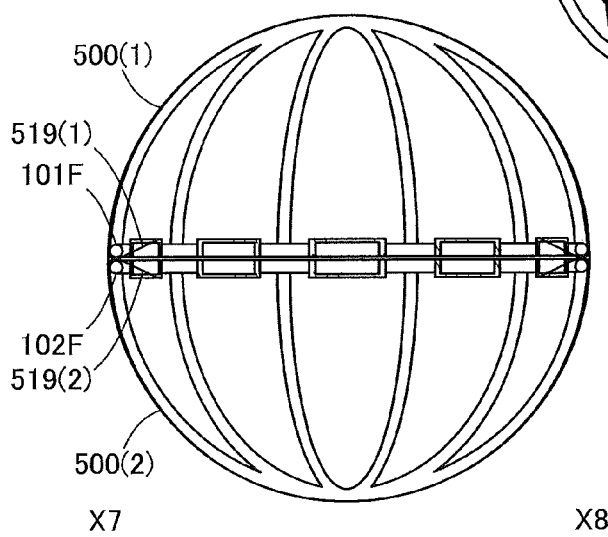

FIG. 7A is a projection view of the input/output device 1003 of one embodiment of the present invention seen obliquely from above, FIG. 7B is a projection view of the input/output device 1003 in which some components are not illustrated, FIG. 7C is a projection view of a framework 100F that can be used in the input/output device 1003 in FIG. 7A, and FIG. 7D is a side view illustrating a structure of a cross section taken along line X7-X8 in FIG. 7A and an internal structure.

<Structural Example of Input/Output Device>

The input/output device 1003 described in this embodiment includes the framework 100F, a flexible first touch panel 500(1) supported by the framework 100F, and a flexible second touch panel 500(2) supported by the framework 100F (see FIGS. 7A and 7C).

The framework 100F includes a first curved portion 111F supporting the first touch panel 500(1), a first straight portion 101F supporting the first touch panel 500(1) so that a first developable surface is formed between the first curved portion 111F and the first straight portion 101F, a second straight portion 102F opposite to the first straight portion 101F, and a second curved portion supporting the second touch panel 500(2) so that the second developable surface is formed between the second straight portion 102F and the second curved portion (see FIGS. 7A and 7C).

The first touch panel 500(1) includes a first light-emitting element, a first terminal portion 519(1) electrically connected to the first light-emitting element, and a region bent along the external shape of the first straight portion 101F between the first light-emitting element and the first terminal portion 519(1) (see FIG. 7D).

The second touch panel 500(2) includes a second light-emitting element, a second terminal portion 519(2) electrically connected to the second light-emitting element, and a region bent along the external shape of the second straight portion 102F between the second light-emitting element and the second terminal portion 519(2).

The input/output device 1003 of one embodiment of the present invention includes the framework 100F including the first curved portion 111F, the first straight portion 101F, and the second straight portion 102F; the flexible first touch panel 500(1) supported by the framework 100F so as to form the first developable surface; and the flexible second touch panel 500(2) supported by the second straight portion 102F opposite to the first straight portion 101F so as to form the second developable surface. Then, the first terminal portion 519(1) included in the first touch panel 500(1) and the second terminal portion 519(2) included in the second touch panel 500(2) are tucked in along the external shapes of the first straight portion 101F and the second straight portion 102F, respectively.

Thus, a three-dimensional body including the curved first developable surface of the first touch panel and the second developable surface of the second touch panel supported by the second straight portion opposite to the first straight portion supporting the first touch panel can be formed. Furthermore, the first terminal portion of the first touch panel and the second terminal portion of the second touch panel can be extracted from between the first straight portion and the second straight portion. Consequently, a novel input/output device that is highly convenient or reliable can be provided. For example, a map or the like is displayed on the input/output device of this embodiment, whereby the input/output device can be used for a terrestrial globe, a celestial globe, or the like. In addition, an instruction to enlarge a part of a map or the like displayed using a touch panel and display the enlarged part can be supplied.

<<Overall Structure>>

The input/output device 1003 of one embodiment of the present invention includes the framework 100F, the first touch panel 500(1), and the second touch panel 500(2).

<<Framework>>

The framework 100F includes the curved portion 111F, the first straight portion 101F, and the second straight portion 102F.

The framework 100F may include twenty-four curved portions and twenty-four straight portions.

The framework 100F may include six pairs of curved portions including four curved portions having a shape along one arc.

<<Touch Panel>>

The first touch panel 500(1) has flexibility and includes the light-emitting element and the first terminal portion 519(1) electrically connected to the light-emitting element.

The second touch panel 500(2) has flexibility and includes the light-emitting element and the second terminal portion 519(2) electrically connected to the light-emitting element.

First image data is supplied to the first terminal portion 519(1), and the first touch panel 500(1) displays the first image data.

Second image data is supplied to the second terminal portion 519(2), and the second touch panel 500(2) displays the second image data.

The first touch panel 500(1) is supported by the framework 100F so that the first image data is displayed on a side on which the convex developable surface is formed (see FIG. 7B).

The second touch panel 500(2) is supported by the framework 100F so that the second image data is displayed on a side on which the convex developable surface is formed.

Note that the first image data may be supplied to the first touch panel 500(1) and the second image data associated with the first image data may be supplied to the second touch panel 500(2) so that an image connecting with an image displayed on the first touch panel 500(1) is displayed on the second developable surface of the second touch panel 500(2)

in a portion adjacent to the first developable surface of the first touch panel 500(1), that is, in the first curved portion 111F.

Thus, for example, an image to be viewed by a user of the input/output device 1003 can be displayed on the first touch panel 500(1) and the second touch panel 500(2) as if an object is placed inside the three-dimensional body including the first developable surface of the first touch panel 500(1) and the second developable surface of the second touch panel 500(2).

Specifically, an image seen by the right eye of the user can be displayed on the first touch panel 500(1) placed on the right side of the user, and an image seen by the left eye of the user can be displayed on the second touch panel 500(2) placed on the left side of the user.

As a result, the user of the input/output device 1003 can see the image as if the object displayed on the input/output device 1003 is actually placed inside the input/output device 1003.

Furthermore, when operation instructions are associated in advance with an image to be displayed, the operation instructions can be supplied using the first touch panel 500(1) or the second touch panel 500(2).

This embodiment can be combined with any of the other embodiments in this specification as appropriate.

Embodiment 5

In this embodiment, a structure of a display panel that can be used in the display device of one embodiment of the present invention will be described with reference to FIGS. 8A to 8C.

Figure 8A:
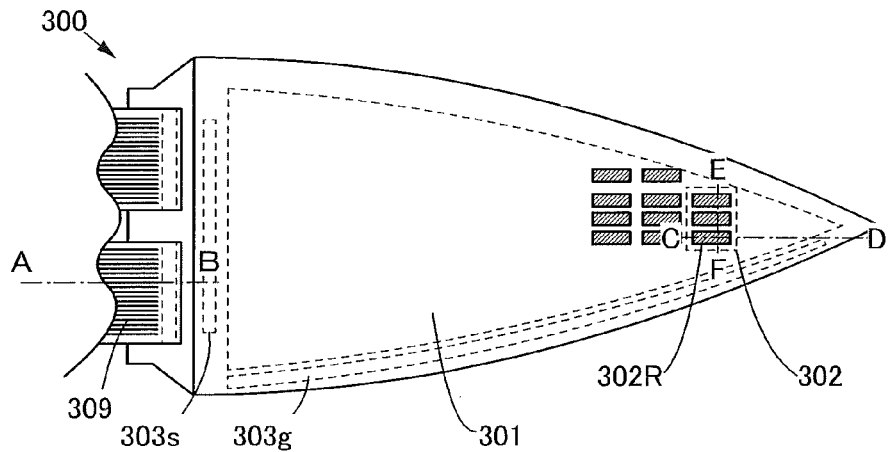
FIGS. 8A to 8C illustrate a structure of a display panel of one embodiment.

FIG. 8A is a plan view illustrating the structure of a display panel that can be used in the display device of one embodiment of the present invention.

Figure 8B:
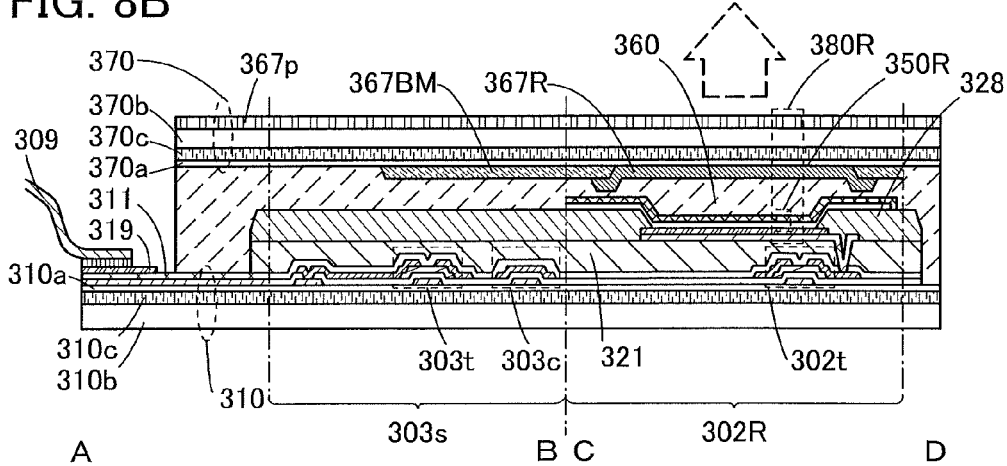

FIG. 8B is a cross-sectional view taken along line A-B and line C-D in FIG. 8A.

Figure 8C:
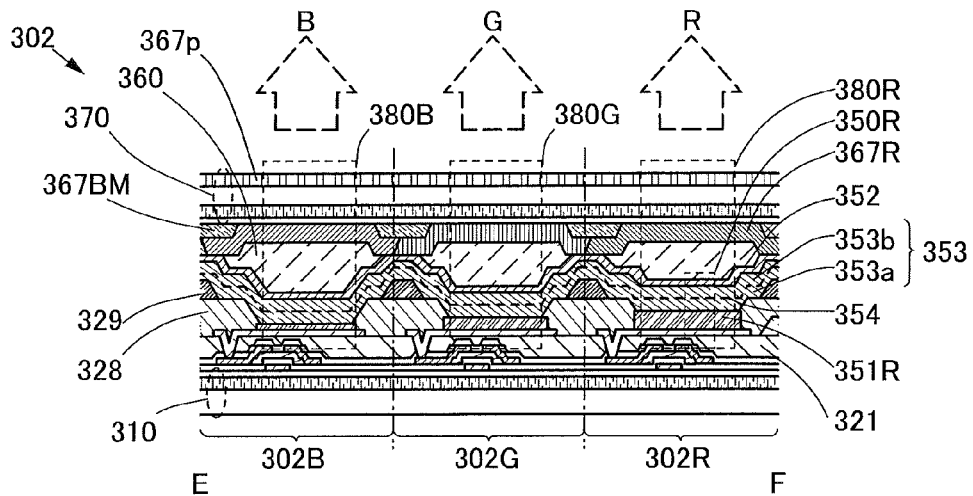

FIG. 8C is a cross-sectional view taken along line E-F in FIG. 8A.

<<Plan View>>

The display panel 300 described as an example in this embodiment includes a display portion 301 (see FIG. 8A).

In the display portion 301, a plurality of pixels 302 is provided, and a plurality of sub-pixels (e.g., a sub-pixel 302R) is provided in each of the pixels 302. In addition, in the sub-pixels, light-emitting elements and pixel circuits that can supply electric power for driving the light-emitting elements are provided.

The pixel circuits are electrically connected to wirings through which selection signals are supplied and wirings through which data signals are supplied.

Furthermore, the display portion 301 is provided with a scan line driver circuit 303g that can supply selection signals and a data line driver circuit 303s that can supply data signals.

<Cross-Sectional View>

The display panel 300 includes a base 310 and a base 370 that faces the base 310 (see FIG. 8B).

The base 310 is a stacked body including a flexible base 310b, a barrier film 310a that prevents diffusion of impurities to the light-emitting elements, and an adhesive layer 310c that attaches the barrier film 310a to the base 310b.

The base 370 is a stacked body including a flexible base 370b, a barrier film 370a that prevents diffusion of impurities to the light-emitting elements, and an adhesive layer 370c that attaches the barrier film 370a to the base 370b.

A sealant 360 also serving as an optical adhesive layer attaches the base 370 to the base 310. The pixel circuits and the light-emitting elements (e.g., a first light-emitting element 350R) are provided between the base 310 and the base 370.

<<Pixel Structure>>

Each of the pixels 302 includes a sub-pixel 302R, a sub-pixel 302G, and a sub-pixel 302B (see FIG. 8C). The sub-pixel 302R includes a light-emitting module 380R, the sub-pixel 302G includes a light-emitting module 380G, and the sub-pixel 302B includes a light-emitting module 380B.

For example, the sub-pixel 302R includes the first light-emitting element 350R and the pixel circuit that can supply electric power to the first light-emitting element 350R and includes a transistor 302t (see FIG. 8B). Furthermore, the light-emitting module 380R includes the first light-emitting element 350R and an optical element (e.g., a first coloring layer 367R).

The first light-emitting element 350R includes a lower electrode 351R, an upper electrode 352, and a layer 353 containing a light-emitting organic compound between the lower electrode 351R and the upper electrode 352.

The layer 353 containing a light-emitting organic compound includes a light-emitting unit 353a, a light-emitting unit 353b, and an intermediate layer 354 between the light-emitting units 353a and 353b.

The light-emitting module 380R includes the first coloring layer 367R on the base 370. The coloring layer transmits light of a particular wavelength and is, for example, a layer that selectively transmits light of red, green, or blue color. A region that transmits light emitted from the light-emitting element as it is may be provided as well.

The light-emitting module 380R, for example, includes the sealant 360 that also serves as an optical adhesive layer and is in contact with the first light-emitting element 350R and the first coloring layer 367R.

The first coloring layer 367R is positioned in a region overlapping with the first light-emitting element 350R. Accordingly, part of light emitted from the first light-emitting element 350R passes through the sealant 360 that also serves as an optical adhesive layer and through the first coloring layer 367R and is emitted to the outside of the light-emitting module 380R as indicated by arrows in FIGS. 8B and 8C.

<<Structure of Display Panel>>

The display panel 300 includes a light-blocking layer 367BM on the base 370. The light-blocking layer 367BM is provided so as to surround the coloring layer (e.g., the first coloring layer 367R).

The display panel 300 includes an anti-reflective layer 367p positioned in a region overlapping with the display portion 301.

The display panel 300 includes an insulating film 321. The insulating film 321 covers the transistor 302t. Note that the insulating film 321 can be used as a layer for planarizing unevenness caused by the pixel circuits. An insulating film on which a layer that can prevent diffusion of impurities to the transistor 302t and the like is stacked can be used as the insulating film 321.

The display panel 300 includes the light-emitting elements (e.g., the first light-emitting element 350R) over the insulating film 321.

The display panel 300 includes, over the insulating film 321, a partition wall 328 that overlaps with an end portion of the lower electrode 351R (see FIG. 8C). In addition, a spacer 329 that controls the distance between the base 310 and the base 370 is provided on the partition wall 328.

<<Structure of Data Line Driver Circuit>>

The data line driver circuit 303s includes a transistor 303t and a capacitor 303c. Note that the driver circuit can be formed over the same substrate and in the same process as those of the pixel circuits.

<<Other Components>>

The display panel 300 includes a wiring 311 through which a signal is supplied. The wiring 311 is provided with a terminal portion 319. Note that a flexible printed circuit 309 through which a signal such as a data signal or a synchronization signal can be supplied is electrically connected to the terminal portion 319.

Note that a printed wiring board (PWB) may be attached to the flexible printed circuit 309. The light-emitting device in this specification includes, in its category, not only the light-emitting device itself but also the light-emitting device provided with a flexible printed circuit or a printed wiring board.

This embodiment can be combined with any of the other embodiments in this specification as appropriate.

Embodiment 6

In this embodiment, a structure of a foldable touch panel that can be used in an input/output device of one embodiment of the present invention will be described with reference to FIGS. 9A and 9B, and FIGS. 10A to 10C.

Figure 9A:
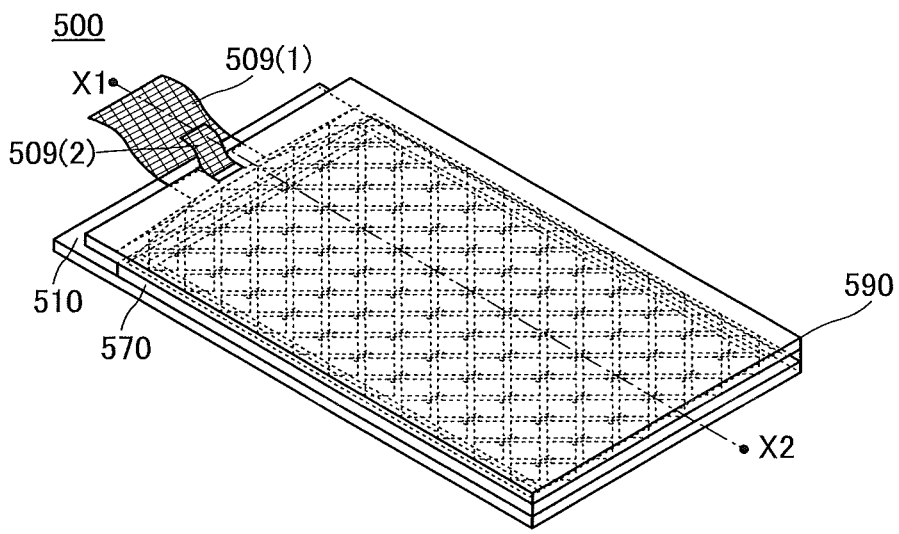
FIGS. 9A and 9B illustrate a structure of a touch panel that can be used in an input/output device of one embodiment.
Figure 9B:
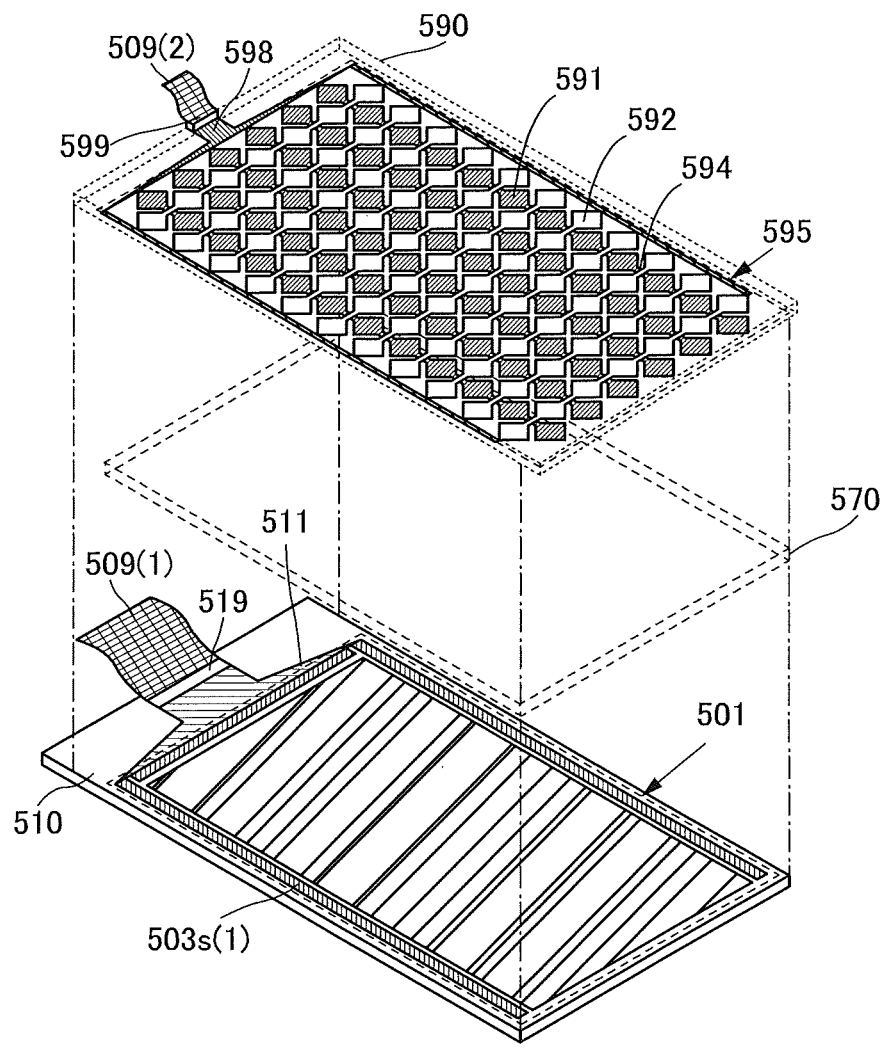

FIG. 9A is a perspective view of a touch panel 500 described in this embodiment. Note that FIGS. 9A and 9B illustrate only main components for simplicity. FIG. 9B is a perspective view of the touch panel 500.

Figure 10A:
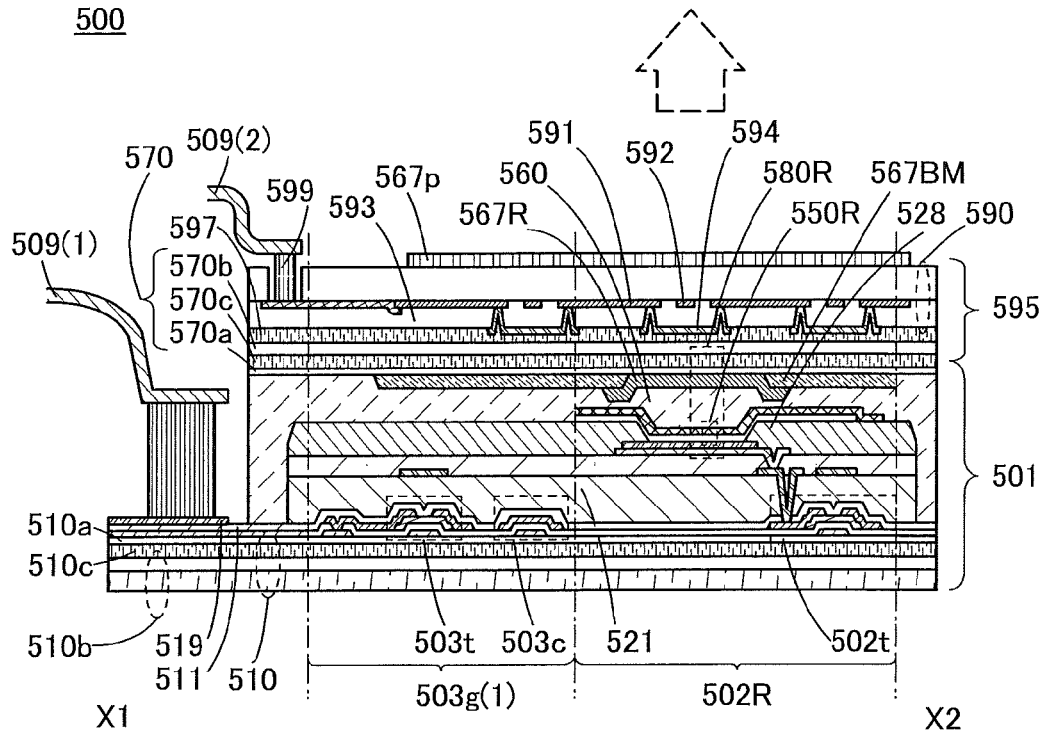
FIGS. 10A to 10C illustrate structures of a touch panel that can be used in an input/output device of one embodiment.

FIG. 10A is a cross-sectional view of the touch panel 500 taken along line X1-X2 in FIG. 9A.

The touch panel 500 includes a display portion 501 and a touch sensor 595 (see FIG. 9B). Furthermore, the touch panel 500 includes the base 510, a base 570, and a base 590. Note that the base 510, the base 570, and the base 590 each have flexibility.

The display portion 501 includes the base 510, a plurality of pixels over the base 510, and a plurality of wirings 511 through which signals are supplied to the pixels. The plurality of wirings 511 is led to a peripheral portion of the base 510, and part of the plurality of wirings 511 forms a terminal portion 519. The terminal portion 519 is electrically connected to a flexible printed circuit 509(1).

<Touch Sensor>

The base 590 includes the touch sensor 595 and a plurality of wirings 598 electrically connected to the touch sensor 595. The plurality of wirings 598 is led to a peripheral portion of the base 590, and part of the plurality of wirings 598 forms the terminal portion 519. The terminal portion 519 is electrically connected to a flexible printed circuit 509(2). Note that in FIG. 9B, electrodes, wirings, and the like of the touch sensor 595 provided on the base 590 are indicated by solid lines for clarity.

As the touch sensor 595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

The case of using a projected capacitive touch sensor will be described below with reference to FIG. 9B.

Note that a variety of sensors that can sense the closeness or the contact of a sensing target such as a forger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 9A and 9B.

The electrodes 591 each have a quadrangular shape and are arranged in a direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

The structure of the touch sensor 595 is described with reference to FIGS. 10A to 10C.

The touch sensor 595 includes the base 590, the electrodes 591 and the electrodes 592 provided in a staggered arrangement on the base 590, an insulating layer 593 covering the electrodes 591 and the electrodes 592, and the wiring 594 that electrically connects the adjacent electrodes 591 to each other.

A resin layer 597 attaches the base 590 to the base 570 so that the touch sensor 595 overlaps with the display portion 501.

The electrodes 591 and the electrodes 592 are for red using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 591 and the electrodes 592 may be formed by depositing a light-transmitting conductive material on the base 590 by a sputtering method and then removing an unnecessary portion by any of various patterning techniques such as photolithography.

Examples of a material for the insulating layer 593 include resins such as an acrylic resin and an epoxy resin, a resin having a siloxane bond, and inorganic insulating materials such as silicon oxide, silicon oxynitride, and aluminum oxide.

Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than the conductivities of the electrodes 591 and 592 can be favorably used for the wiring 594 because electric resistance can be reduced.

One electrode 592 extends in one direction, and a plurality of electrodes 592 is provided in the form of stripes.

The wiring 594 intersects with the electrode 592.

Adjacent electrodes 591 are provided with one electrode 592 provided therebetween. The wiring 594 electrically connects the adjacent electrodes 591.

Note that the plurality of electrodes 591 is not necessarily arranged in the direction orthogonal to one electrode 592 and may be arranged to intersect with one electrode 592 at an angle of less than 90 degrees.

One wiring 598 is electrically connected to any of the electrodes 591 and 592. Part of the wiring 598 serves as a terminal portion. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

Furthermore, a connection layer 599 electrically connects the wiring 598 to the flexible printed circuit 509(2).

As the connection layer 599, any of various anisotropic conductive films (ACF), anisotropic conductive pastes (ACP), or the like can be used.

The resin layer 597 has a light-transmitting property. For example, a thermosetting resin or an ultraviolet curable resin can be used; specifically, a resin such as an acrylic resin, a urethane resin, air epoxy resin, or a resin having a siloxane bond can be used.

<Display Portion>

The display portion 501 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

For example, organic electroluminescent elements that emit light of different colors may be included in sub-pixels so that the light of different colors can be emitted from the respective sub-pixels.

Other than organic electroluminescent elements, any of various display elements such as display elements that perform display by an electrophoretic method (electronic ink), an electronic liquid powder (registered trademark) method, an electrowetting method, or the like; MEMS shutter display elements; optical interference type MEMS display elements; and liquid crystal elements can be used.

Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some or all of pixel electrodes function as reflective electrodes. For example, some or all of pixel electrodes are formed to contain aluminum, silver, or the like. In such a case, a storage circuit such as an SRAM can be provided under the reflective electrodes, leading to lower power consumption. A structure suitable for employed display elements can be selected from among a variety of structures of pixel circuits.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has a small number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

Flexible materials can be favorably used in the base 510 and the base 570.

Materials with which passage of impurities is inhibited can be favorably used in the base 510 and the base 570. For example, materials with a vapor permeability of lower than or equal to $10^{-5}$ g/(m$^2$·day), preferably lower than or equal to $10^{-6}$ g/(m$^2$·day) can be favorably used.

The base 510 can be favorably formed using a material whose coefficient of linear expansion is substantially equal to that of the base 570. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

The base 510 is a stack in which a flexible base 510b, a barrier film 510a that prevents diffusion of impurities to light-emitting elements, and a resin layer 510c that attaches the barrier film 510a to the base 510b are stacked.

For example, materials that include polyester, polyolefin, polyamide (e.g., nylon, aramid), polyimide, polycarbonate, or a resin having an acrylic bond, a urethane bond, an epoxy bond, or a siloxane bond can be used for the resin layer 510c.

The base 570 is a stack in which a flexible base 570b, a barrier film 570a that prevents diffusion of impurities to the light-emitting elements, and a resin layer 570c that attaches the barrier film 570a to the base 570b are stacked.

A sealant 560 attaches the base 570 to the base 510. The sealant 560 has a refractive index higher than that of air. In the case where light is extracted to the sealant 560 side, the sealant 560 also serves as an optical adhesive layer. The pixel circuits and the light-emitting elements (e.g., a first light-emitting element 550R) are provided between the base 510 and the base 570.

<<Pixel Structure>>

A pixel includes a sub-pixel 502R, and the sub-pixel 502R includes a light-emitting module 580R.

The sub-pixel 502R includes the first light-emitting element 550R and the pixel circuit that can supply electric power to the first light-emitting element 550R and includes a transistor 502*t*. Furthermore, the light-emitting module 580R includes the first light-emitting element 550R and an optical element (e.g., a coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

In the case where the sealant 560 is provided on the light extraction side, the sealant 560 is in contact with the first light-emitting element 550R and the first coloring layer 567R.

The first coloring layer 567R is positioned in a region overlapping with the first light-emitting element 550R. Accordingly, part of light emitted from the light-emitting element 550R passes through the first coloring layer 567R and is emitted to the outside of the light-emitting module 580R as indicated by an arrow in FIG. 10A.

<<Structure of Display Portion>>

The display portion 501 includes a light-blocking layer 567BM on the light emitting side. The light-blocking layer 567BM is provided so as to surround the coloring layer (e.g., the first coloring layer 567R).

The display portion 501 includes an anti-reflective layer 567*p* positioned in a region overlapping with pixels. As the anti-reflective layer 567*p*, a circular polarizing plate can be used, for example.

The display portion 501 includes an insulating film 521. The insulating film 521 covers the transistor 502*t*. Note that the insulating film 521 can be used as a layer for planarizing unevenness due to the pixel circuit. A stacked film including a layer that can prevent diffusion of impurities can be used as the insulating film 521. This can prevent the reliability of the transistor 502*t* or the like from being lowered by diffusion of unintentional impurities.

The display portion 501 includes the light-emitting elements (e.g., the first light-emitting element 550R) over the insulating film 521.

The display portion 501 includes, over the insulating film 521, a partition wall 528 that overlaps with an end portion of the lower electrode. In addition, a spacer that controls the distance between the base 510 and the base 570 is provided on the partition wall 528.

<<Structural Example of Scan Line Driver Circuit>>

A scan line driver circuit 503*g*(1) includes a transistor 503*t* and a capacitor 503*c*. Note that the driver circuit can be formed in the same process and over the same substrate as those of the pixel circuits.

<<Other Components>>

The display portion 501 includes the wirings 511 through which signals can be supplied. The wirings 511 are provided with the terminal portion 519. Note that the flexible printed circuit 509(1) through which a signal such as an image signal or a synchronization signal are supplied is electrically connected to the terminal portion 519.

Note that a printed wiring board (PWB) may be attached to the flexible printed circuit 509(1).

The display portion 501 includes wirings such as scan lines, signal lines, and power supply lines. Any of various conductive films can be used as the wirings.

Specifically, a metal element selected from aluminum, gold, platinum, silver, copper, chromium, tantalum, titanium, molybdenum, tungsten, nickel, iron, cobalt, palladium, and manganese, or the like can be used. Alternatively, an alloy including any of the above-described metal elements, or the like can be used. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, an alloy film or a nitride film in which aluminum and one or more elements selected from titanium, tantalum, tungsten, molybdenum, chromium, neodymium, and scandium are combined may be used.

Alternatively, a light-transmitting conductive material including indium oxide, tin oxide, or zinc oxide may be used.

<Modification Example 1 of Display Portion>

Any of various kinds of transistors can be used in the display portion 501.

Figure 10B:
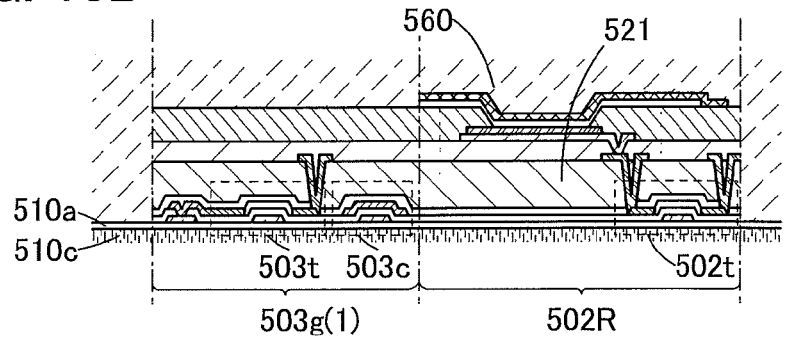

A structure in the case of using bottom-gate transistors in the display portion 501 is illustrated in FIGS. 10A and 10B.

For example, a semiconductor layer containing an oxide semiconductor, amorphous silicon, or the like can be used in the transistor 502*t* and the transistor 503*t* illustrated in FIG. 10A.

For example, a film represented by an In-M-Zn oxide that contains at least indium (In), zinc (Zn), and M (M is a metal such as Al, Ga, Ge, Y, Zr, Sn, La, Ce, or Hf) is preferably included. Alternatively, both In and Zn are preferably contained.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in an oxide semiconductor film, any of the followings can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

For example, a semiconductor layer containing polycrystalline silicon that is obtained by crystallization process such as laser annealing can be used in the transistor 502t and the transistor 503t shown in FIG. 10B.

Figure 10C:
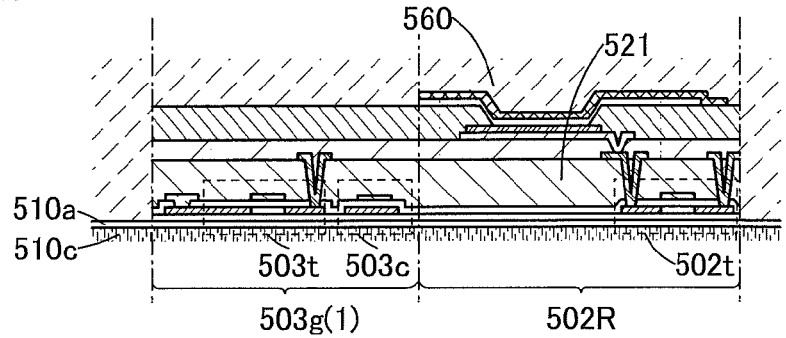

A structure of the case of using top-gate transistors in the display portion 501 is illustrated in FIG. 10C.

For example, a semiconductor layer containing polycrystalline silicon, a single crystal silicon film that is transferred from a single crystal silicon substrate, or the like can be used in the transistor 502t and the transistor 503t illustrated in FIG. 10C.

This embodiment can be combined with any of the other embodiments in this specification as appropriate.

Embodiment 7

In this embodiment, a structure of a foldable touch panel that can be used in an input/output device of one embodiment of the present invention will be described with reference to FIGS. 11A to 11C.

Figure 11A:
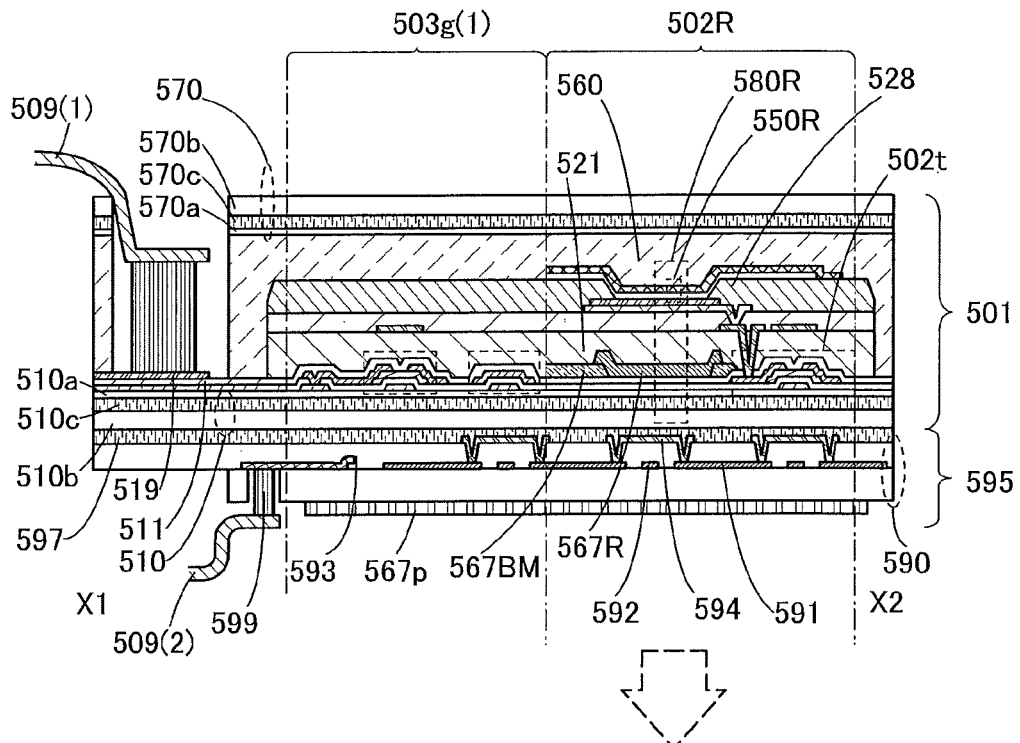
FIGS. 11A to 11C illustrate structures of a touch panel that can be used in an input/output device of one embodiment.
Figure 11B:
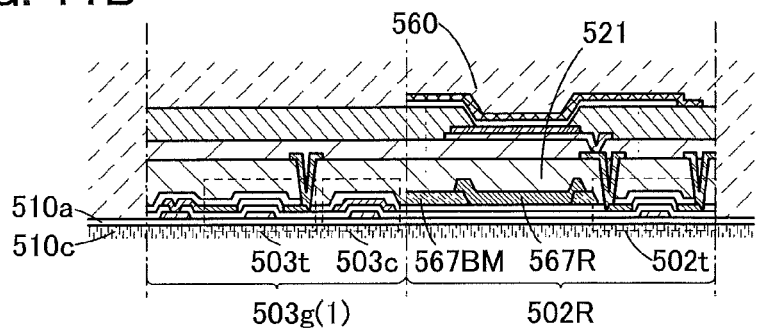
Figure 11C:
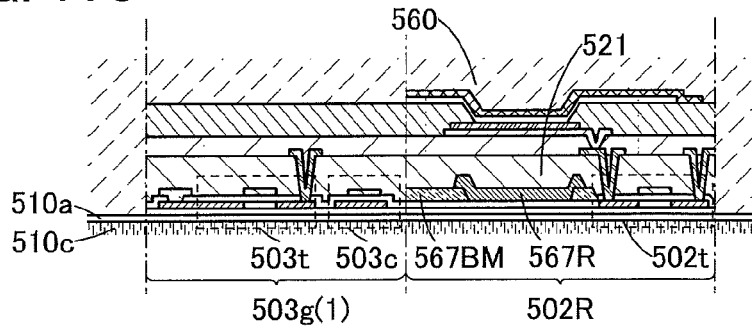

FIGS. 11A to 11C are cross-sectional views illustrating a touch panel 500B.

The touch panel 500B described in this embodiment is different from the touch panel 500 described in Embodiment 6 in that the display portion 501 displays a received image data on the side where the transistors are provided and that the touch sensor is provided on the base 510 side of the display portion. Different components will be described in detail below, and the above description is referred to for the other similar components.

<Display Portion>

The display portion 501 includes a plurality of pixels arranged in a matrix. Each of the pixels includes a display element and a pixel circuit for driving the display element.

<<Pixel Structure>>

A pixel includes the sub-pixel 502R, and the sub-pixel 502R includes a light-emitting module 580R.

The sub-pixel 502R includes the first light-emitting element 550R and the pixel circuit that can supply electric power to the first light-emitting element 550R and includes a transistor 502t.

Furthermore, the light-emitting module 580R includes the first light-emitting element 550R and an optical element (e.g., the coloring layer 567R).

The first light-emitting element 550R includes a lower electrode, an upper electrode, and a layer containing a light-emitting organic compound between the lower electrode and the upper electrode.

The light-emitting module 580R includes the first coloring layer 567R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

The first coloring layer 567R is positioned in a region overlapping with the first light-emitting element 550R. The first light-emitting element 550R shown in FIG. 11A emits light to the side where the transistor 502t is provided. Accordingly, part of light emitted from the first light-emitting element 550R passes through the first coloring layer 567R and is emitted to the outside of the light-emitting module 580R as indicated by an arrow in FIG. 11A.

<<Structure of Display Portion>>

The display portion 501 includes a light-blocking layer 567BM on the light emitting side. The light-blocking layer 567BM is provided so as to surround the coloring layer (e.g., the first coloring layer 567R).

The display portion 501 includes the insulating film 521. The insulating film 521 covers the transistor 502t. Note that the insulating film 521 can be used as a layer for planarizing unevenness due to the pixel circuit. A stacked film including a layer that can prevent diffusion of impurities can be used as the insulating film 521. This can prevent the decrease of the reliability of the transistor 502t or the like due to diffusion of impurities from the coloring layer 567R.

<<Touch Sensor>>

The touch sensor 595 is provided on the base 510 side of the display portion 501 (see FIG. 11A).

The resin layer 597 is provided between the base 510 and the base 590 and attaches the touch sensor 595 to the display portion 501.

<Modification Example 1 of Display Portion>

Any of various kinds of transistors can be used in the display portion 501.

A structure in which bottom-gate transistors are used in the display portion 501 is illustrated in FIGS. 11A and 11B.

For example, a semiconductor layer containing an oxide semiconductor, amorphous silicon, or the like can be used in the transistor 502t and the transistor 503t shown in FIG. 11A. In the transistors, a channel formation region may be sandwiched between upper and lower gate electrodes, in which case variations in characteristics of the transistors can be prevented and thus the reliability can be increased.

For example, a semiconductor layer containing polycrystalline silicon or the like can be used in the transistor 502t and the transistor 503t shown in FIG. 11B.

A structure in which top-gate transistors are used in the display portion 501 is shown in FIG. 11C.

For example, a semiconductor layer including polycrystalline silicon, a transferred single crystal silicon film, or the like can be used in the transistor 502t and the transistor 503t shown in FIG. 11C.

This embodiment can be combined with any of the other embodiments in this specification as appropriate.

Embodiment 8

In this embodiment, a method of manufacturing a stack that can be used in the manufacture of the display device or input/output device of one embodiment of the present invention is described with reference to FIGS. 12A1 to 12E2.

FIGS. 12A1 to 12E2 are schematic views illustrating a process of manufacturing the stack. Cross-sectional views illustrating structures of a processed member and the stack are shown on the left side of FIGS. 12A1 to 12E2, and top views corresponding to the cross-sectional views except FIG. 12C are shown on the right side.

<Method of Manufacturing Stack>

A method of manufacturing a stack 81 from a processed member 80 is described with reference to FIGS. 12A1 to 12E2.

The processed member 80 includes a first substrate F1, a first separation layer F2 in contact with the first substrate F1, a first layer F3 to be separated whose one surface is in contact with the first separation layer F2, a bonding layer 30 whose one surface is in contact with the other surface of the first layer F3 to be separated, and a base layer S5 in contact with the other surface of the bonding layer 30 (see FIGS. 12A1 and 12A2).

Note that a structure of the processed member 80 is described in detail in Embodiment 10.

<<Formation of Separation Starting Points>>

The processed member 80 in which separation starting points F3s are formed in the vicinity of edges of the bonding layer 30 is prepared.

The separation starting points F3s are formed by separating part of the first layer F3 to be separated, from the first substrate F1.

Part of the first layer F3 to be separated can be separated from the separation layer F2 by inserting a sharp tip into the first layer F3 to be separated, from the first substrate F1 side, or by a method using a laser or the like (e.g., a laser ablation method). Thus, the separation starting point F3s can be formed.

<<First Step>>

The processed member 80 in which the separation starting points F3s are formed in the vicinity of the edges of the bonding layer 30 in advance is prepared (see FIGS. 12B1 and 12B2).

<<Second Step>>

One surface layer 80b of the processed member 80 is separated. As a result, a first remaining portion 80a is obtained from the processed member 80.

Specifically, from the separation starting point F3s formed in the vicinity of the edge of the bonding layer 30, the first substrate F1, together with the first separation layer F2, is separated from the first layer F3 to be separated (see FIG. 12C). Consequently, the first remaining portion 80a including the first layer F3 to be separated, the bonding layer 30 whose one surface is in contact with the first layer F3 to be separated, and the base layer S5 in contact with the other surface of the bonding layer 30 is obtained.

The separation may be performed while the vicinity of the interface between the first separation layer F2 and the first layer F3 to be separated is irradiated with ions to remove static electricity. Specifically, the ions may be generated by an ionizer.

Furthermore, when the first layer F3 to be separated is separated from the first separation layer F2, a liquid is injected into the interface between the first separation layer F2 and the first layer F3 to be separated. Alternatively, a liquid may be ejected and sprayed by a nozzle 99. For example, as the injected liquid or the sprayed liquid, water, a polar solvent, or the like can be used.

By injecting the liquid, an influence of static electricity and the like generated with the separation can be reduced. Alternatively, the separation may be performed while a liquid that dissolves the separation layer is injected.

In particular, in the case where a film containing tungsten oxide is used as the first separation layer F2, the first layer F3 to be separated is preferably separated while a liquid containing water is injected or sprayed because a stress applied to the first layer F3 to be separated due to the separation can be reduced.

<<Third Step>>

A first adhesive layer 31 is formed on the first remaining portion 80a and the first remaining portion 80a is bonded to a first support 41 with the first adhesive layer 31 (see FIGS. 12D1, 12D2, 12E1, and 12E2). Consequently, the stack 81 is obtained from the first remaining portion 80a.

Specifically, the stack 81 including the first support 41, the first adhesive layer 31, the first layer F3 to be separated, the bonding layer 30 whose one surface is in contact with the first layer F3 to be separated, and the base layer S5 in contact with the other surface of the bonding layer 30 is obtained.

To form the bonding layer 30, any of a variety of methods can be used. For example, the bonding layer 30 can be formed with a dispenser, by a screen printing method, or the like. The bonding layer 30 is cured by a method selected depending on its material. For example, when a light curable adhesive is used for the bonding layer 30, light including light of a predetermined wavelength is emitted.

This embodiment can be combined with any of the other embodiments described in this specification as appropriate.

Embodiment 9

In this embodiment, a method of manufacturing a stack that can be used in the manufacture of the display device or input/output device of one embodiment of the present invention is described with reference to FIGS. 13A1 to 13E2 and FIGS. 14A1 to 14E2.

FIGS. 13A1 to 13E2 and FIGS. 14A1 to 14E2 are schematic views illustrating a process of manufacturing the stack. Cross-sectional views illustrating structures of a processed member and the stack are shown on the left side of FIGS. 13A1 to 13E2 and FIGS. 14A1 to 14E2, and top views corresponding to the cross-sectional views except FIG. 13C and FIGS. 14B and 14C are shown on the right side.

<Method of Manufacturing Stack>

A method of manufacturing a stack 92 from a processed member 90 is described with reference to FIGS. 13A1 to 13E2 and FIGS. 14A1 to 14E2.

The processed member 90 is different from the processed member 80 in that the other surface of the bonding layer 30 is in contact with one surface of a second layer S3 to be separated instead of the material S5.

Specifically, the difference is that the second substrate S1 instead of the base layer S5, a second separation layer S2 over the second substrate S1, and the second layer S3 to be separated whose other surface is in contact with the second separation layer S2 are included, and that one surface of the second layer S3 to be separated is in contact with the other surface of the bonding layer 30.

In the processed member 90, the first substrate F1, the first separation layer F2, the first layer F3 to be separated whose one surface is in contact with the first separation layer F2, the bonding layer 30 whose one surface is in contact with the other surface of the first layer F3 to be separated, the second layer S3 to be separated whose one surface is in contact with the other surface of the bonding layer 30, the second separation layer S2 whose one surface is in contact with the other surface of the second layer S3 to be separated, and the second substrate S1 are placed in this order (see FIGS. 13A1 and 13A2).

Note that a structure of the processed member 90 is described in detail in Embodiment 10.

<<First Step>>

The processed member 90 in which the separation starting points F3s are formed in the vicinity of the edges of the bonding layer 30 is prepared (see FIGS. 13B1 and 13B2).

The separation starting point F3s is formed by separating part of the first layer F3 to be separated, from the first substrate F1.

For example, part of the first layer F3 to be separated can be separated from the separation layer F2 by inserting a sharp tip into the first layer F3 to be separated, from the first substrate F1 side, or by a method using a laser or the like (e.g., a laser ablation method). Thus, the separation starting point F3s can be formed.

<<Second Step>>

One surface layer 90b of the processed member 90 is separated. As a result, a first remaining portion 90a is obtained from the processed member 90.

Specifically, from the separation starting point F3s formed in the vicinity of the edge of the bonding layer 30, the first substrate F1, together with the first separation layer F2, is separated from the first layer F3 to be separated (see FIG. 13C). Consequently, the first remaining portion 90a in which the first layer F3 to be separated, the bonding layer 30 whose one surface is in contact with the first layer F3 to be separated, the second layer S3 to be separated whose one surface is in contact with the other surface of the bonding layer 30, the second separation layer S2 whose one surface is in contact with the other surface of the second layer S3 to be separated, and the second substrate S1 are placed in this order is obtained.

Note that the separation may be performed while the vicinity of the interface between the second separation layer S2 and the second layer S3 to be separated is irradiated with ions to remove static electricity. Specifically, the ions may be generated by an ionizer.

Furthermore, when the second layer S3 to be separated is separated from the second separation layer S2, a liquid is injected into the interface between the second separation layer S2 and the second layer S3 to be separated. Alternatively, a liquid may be ejected and sprayed by a nozzle 99. For example, as the liquid to be injected or the liquid to be sprayed, water, a polar solvent, or the like can be used.

By injecting the liquid, an influence of static electricity and the like generated with the separation can be reduced. Alternatively, the separation may be performed while a liquid that dissolves the separation layer is injected.

In particular, in the case where a film containing tungsten oxide is used as the second separation layer S2, the second layer S3 to be separated is preferably separated while a liquid containing water is injected or sprayed because a stress applied to the second layer S3 to be separated due to the separation can be reduced.

<<Third Step>>

A first adhesive layer 31 is formed on the first remaining portion 90a (see FIGS. 13D1 and 13D2), and the first remaining portion 90a is bonded to a first support 41 with the first adhesive layer 31. Consequently, a stack 91 is obtained from the first remaining portion 90a.

Specifically, the stack 91 in which the first support 41, the first adhesive layer 31, the first layer F3 to be separated, the bonding layer 30 whose one surface is in contact with the first layer F3 to be separated, the second layer S3 to be separated whose one surface is in contact with the other surface of the bonding layer 30, the second separation layer S2 whose one surface is in contact with the other surface of the second layer S3 to be separated, and the second substrate S1 are placed in this order is obtained (see FIGS. 13E1 and 13E2).

<<Fourth Step>>

Part of the second layer S3 to be separated in the vicinity of the edge of the first adhesive layer 31 of the stack 91 is separated from the second substrate S1 to form a second separation starting point 91s.

For example, the first support 41 and the first adhesive layer 31 are cut from the first support 41 side, and part of the second layer S3 to be separated is separated from the second substrate S1 along an edge of the first adhesive layer 31 which is newly formed.

Specifically, the first adhesive layer 31 and the first support 41 in a region which is over the second separation layer S2 and in which the second layer S3 to be separated is provided are cut with a blade or the like including a sharp tip, and along a newly formed edge of the first adhesive layer 31, the second layer S3 to be separated is partly separated from the second substrate S1 (see FIGS. 14A1 and 14A2).

Consequently, the separation starting points 91s are formed in the vicinity of newly formed edges of the first support 41b and the first adhesive layer 31.

<<Fifth Step>>

A second remaining portion 91a is separated from the stack 91. As a result, the second remaining portion 91a is obtained from the stack 91 (see FIG. 14C).

Specifically, from the separation starting point 91s formed in the vicinity of the edge of the first adhesive layer 31, the second substrate S1, together with the second separation layer S2, is separated from the second layer S3 to be separated. Consequently, the second remaining portion 91a in which the first support 41b, the first adhesive layer 31, the first layer F3 to be separated, the bonding layer 30 whose one surface is in contact with the first layer F3 to be separated, and the second layer S3 to be separated whose one surface is in contact with the other surface of the bonding layer 30 are placed in this order is obtained.

Note that the separation may be perform led while the vicinity of the interface between the second separation layer S2 and the second layer S3 to be separated is irradiated with ions to remove static electricity. Specifically, the ions may be generated by an ionizer.

Furthermore, when the second layer S3 to be separated is separated from the second separation layer S2, a liquid is injected into the interface between the second separation layer S2 and the second layer S3 to be separated. Alternatively, a liquid may be ejected and sprayed by a nozzle 99. For example, as the liquid to be injected or the liquid to be sprayed, water, a polar solvent, or the like can be used.

By injecting the liquid, an influence of static electricity and the like generated with the separation can be reduced. Alternatively, the separation may be performed while a liquid that dissolves the separation layer is injected.

In particular, in the case where a film containing tungsten oxide is used as the second separation layer S2, the second layer S3 to be separated is preferably separated while a liquid containing water is injected or sprayed because a stress applied to the second layer S3 to be separated due to the separation can be reduced.

<<Sixth Step>>

A second adhesive layer 32 is formed on the second remaining portion 91a (see FIGS. 14D1 and 14D2).

The second remaining portion 91a is bonded to the second support 42 with the second adhesive layer 32. Consequently, a stack 92 is obtained from the second remaining portion 91a (see FIGS. 14E1 and 14E2).

Specifically, the stack 92 in which first support 41b, the first adhesive layer 31, the first layer F3 to be separated, the bonding layer 30 whose one surface is in contact with the first layer F3 to be separated, the second layer S3 to be separated whose one surface is in contact with the other surface of the bonding layer 30, the second adhesive layer 32, and the second support 42 are placed in this order is obtained.

<Method of Manufacturing Stack Including Opening Portion in Support>

A method of manufacturing a stack including an opening portion in a support is described with reference to FIGS. 15A1 to 15D2.

FIGS. 15A1 to 15D2 illustrate the method of manufacturing a stack including an opening portion which exposes part of a layer to be separated in a support. Cross-sectional views illustrating structures of the stack are shown on the left side of FIGS. 15A1 to 15D2, and top views corresponding to the cross-sectional views are shown on the right side.

FIGS. 15A1 to 15B2 illustrate a method of manufacturing a stack 92c comprising an opening portion in a processed member 92b using a second support 42b which is smaller than the first support 41b.

FIGS. 15C1 to 15D2 illustrate a method of manufacturing a stack 92d comprising an opening portion formed in the second support 42.

<<Example 1 of Method of Manufacturing Stack Comprising Opening Portion in Support>>

A method of manufacturing a stack has the same step as the above sixth step except that the second support 42b which is smaller than the first support 41b is used instead of the second support 42 and a second adhesive layer 32b which is smaller than the second adhesive layer 32 is used instead of the second adhesive layer 32. By this method, a stack in which part of the second layer S3 to be separated is exposed can be manufactured (see FIGS. 15A1 and 15A2).

As the second adhesive layer 32, a liquid adhesive can be used. Alternatively, an adhesive whose fluidity is inhibited and which is formed in a single wafer shape in advance (also referred to as a sheet-like adhesive) can be used. By using the sheet-like adhesive, the amount of part of the adhesive layer 32 which extends beyond the second support 42b can be small. In addition, the adhesive layer 32 can have a uniform thickness easily.

Part of the exposed part of the second layer S3 to be separated is cut off, and the first layer F3 to be separated may be exposed (see FIGS. 15B1 and 15B2).

Specifically, with a blade or the like which has a sharp tip, a slit is formed in the exposed second layer S3 to be separated. Then, for example, an adhesive tape or the like is attached to part of the exposed second layer S3 to be separated to concentrate stress near the slit, and the part of the exposed second layer S3 to be separated is separated together with the attached tape or the like, whereby the part of the second layer S3 to be separated can be selectively removed.

Moreover, a layer which can suppress the bonding power of the bonding layer 30 to the first layer F3 to be separated may be selectively formed on part of the first layer F3 to be separated. For example, a material which is not easily bonded to the bonding layer 30 may be selectively formed. Specifically, an organic material may be deposited into an island shape. Thus, part of the bonding layer 30 can be selectively removed together with the second layer S3 to be separated easily. As a result, the first layer F3 to be separated can be exposed.

Note that for example, in the case where the first layer F3 to be separated includes a functional layer and a conductive layer F3b electrically connected to the functional layer, the conductive layer F3b can be exposed in an opening portion in the second stack 92c. Thus, the conductive layer F3b exposed in the opening portion can be used as a terminal supplied with a signal.

As a result, the conductive layer F3b part of which is exposed in the opening portion can be used as a terminal that can extract a signal supplied though the functional layer, or can be used as a terminal to which a signal supplied to the functional layer can be supplied by an external device.

<<Example 2 of Method of Manufacturing Stack Comprising Opening Portion in Support>>

A mask 48 comprising an opening portion formed to overlap with an opening portion formed in the second support 42 is formed on the stack 92. Next, a solvent 49 is dropped into the opening portion in the mask 48. Thus, with the solvent 49, the second support 42 exposed in the opening portion in the mask 48 can be swelled or dissolved (see FIGS. 15C1 and 15C2).

After the extra solvent 49 is removed, stress is applied by, for example, rubbing the second support 42 exposed in the opening portion in the mask 48. Thus, the second support 42 or the like in a portion overlapping with the opening portion in the mask 48 can be removed.

Moreover, with a solvent with which the bonding layer 30 is swelled or dissolved, the first layer F3 to be separated can be exposed (see FIGS. 15D1 and 15D2).

This embodiment can be combined with any of the other embodiments described in this specification as appropriate.

Embodiment 10

In this embodiment, a structure of a processed member that can be processed into the display device or input/output device of one embodiment of the present invention is described with reference to FIGS. 16A1 to 16B2.

FIGS. 16A1 to 16B2 are schematic views illustrating a structure of a processed member that can be processed into the stack.

FIG. 16A1 is a cross-sectional view illustrating a structure of the processed member 80 which can processed into the stack, and FIG. 16A2 is a top view corresponding to the cross-sectional view.

FIG. 16B1 is a cross-sectional view illustrating a structure of the processed member 90 which can processed into the stack, and FIG. 16B2 is a top view corresponding to the cross-sectional view.

<1. Structural Example of Processed Member>

The processed member 80 includes a first substrate F1, the first separation layer F2 in contact with the first substrate F1, the first layer F3 to be separated whose one surface is in contact with the first separation layer F2, the bonding layer 30 whose one surface is in contact with the other surface of the first layer F3 to be separated, and the base layer S5 in contact with the other surface of the bonding layer 30 (see FIGS. 16A1 and 16A2).

Note that the separation starting points F3s may be formed in the vicinity of the edges of the bonding layer 30.

<<First Substrate>>

There is no particular limitation on the first substrate F1 as long as it has heat resistance high enough to withstand a manufacturing process and a thickness and a size which can be used in a manufacturing apparatus.

For the first substrate F1, an organic material, an inorganic material, a composite material of an organic material and an inorganic material, or the like can be used.

For example, an inorganic material such as glass, ceramic, or metal, can be used for the first substrate F1.

Specifically, non-alkali glass, soda-lime glass, potash glass, crystal glass, or the like can be used for the first substrate F1.

Specifically, a metal oxide film, a metal nitride film, a metal oxynitride film, or the like can be used for the first substrate F1. For example, silicon oxide, silicon nitride, silicon oxynitride, an alumina film, or the like can be used for the first substrate F1.

Specifically, SUS, aluminum, or the like can be used for the first substrate F1.

For example, an organic material such as a resin, a resin film, or a plastic can be used for the first substrate F1.

Specifically, a resin film or a resin plate of polyester, polyolefin, polyamide, polyimide, polycarbonate, an acrylic resin, or the like can be used for the first substrate F1.

For example, a composite material such as a resin film to which a metal plate, a thin glass plate, or a film of an inorganic material is attached can be used as the first substrate F1.

For example, a composite material formed by dispersing a fibrous or particulate metal, glass, inorganic material, or the like into a resin film can be used as the first substrate F1.

For example, a composite material formed by dispersing a fibrous or particulate resin, organic material, or the like into an inorganic material can be used as the first substrate F1.

For the first substrate F1, a single-layer material or a stacked-layer material in which a plurality of layers are stacked can be used. For example, a stacked-layer material in which a base layer, an insulating layer that prevents diffusion of impurities contained in the base layer, and the like are stacked can be used for the first substrate F1.

Specifically, a stacked-layer material in which glass and one or a plurality of films that prevents diffusion of impurities contained in the glass and that are selected from a silicon oxide film, a silicon nitride film, a silicon oxynitride film, and the like are stacked can be used for the first substrate F1.

Alternatively, a stacked-layer material in which a resin and a film that prevents diffusion of impurities contained in the resin, such as a silicon oxide film, a silicon nitride film, and a silicon oxynitride film are stacked can be used for the first substrate F1.

<<First Separation Layer>>

The first separation layer F2 is provided between the first substrate F1 and the first layer F3 to be separated. In the vicinity of the first separation layer F2, a boundary where the first layer F3 to be separated can be separated from the first substrate F1 is formed. There is no particular limitation on the first separation layer F2 as long as it has heat resistance high enough to withstand the manufacturing process of the first layer F3 to be separated formed thereon.

For the first separation layer F2, for example, an inorganic material, an organic resin, or the like can be used.

Specifically, an inorganic material such as a metal containing an element selected from tungsten, molybdenum, titanium, tantalum, niobium, nickel, cobalt, zirconium, zinc, ruthenium, rhodium, palladium, osmium, iridium, and silicon, an alloy containing the element, or a compound containing the element can be used for the first separation layer F2.

Specifically, an organic material such as polyimide, polyester, polyolefin, polyamide, polycarbonate, or an acrylic resin can be used.

For example, a single-layer material or a stacked-layer material in which a plurality of layers are stacked can be used for the first separation layer F2.

Specifically, a material in which a layer containing tungsten and a layer containing an oxide of tungsten are stacked can be used for the first separation layer F2.

The layer containing an oxide of tungsten can be formed by a method in which another layer is stacked on a layer containing tungsten. Specifically, the layer containing an oxide of tungsten may be formed by a method in which silicon oxide, silicon oxynitride, or the like is stacked on a layer containing tungsten.

The layer containing an oxide of tungsten may be formed by subjecting a surface of a layer containing tungsten to thermal oxidation treatment, oxygen plasma treatment, nitrous oxide ($N_2O$) plasma treatment, treatment with a solution with high oxidizing power (e.g., ozone water), or the like.

Specifically, a layer containing polyimide can be used as the first separation layer F2. The layer containing polyimide has heat resistance high enough to withstand the various manufacturing steps required to form the first layer F3 to be separated.

For example, the layer containing polyimide has heat resistance of 200° C. or higher, preferably 250° C. or higher, more preferably 300° C. or higher, still more preferably 350° C. or higher.

By heating a film containing a monomer formed on the first substrate F1, a film containing polyimide obtained by condensation of the monomer can be used.

<<First Layer to be Separated>>

There is no particular limitation on the first layer F3 to be separated as long as it can be separated from the first substrate F1 and has heat resistance high enough to withstand the manufacturing process.

The boundary where the first layer F3 to be separated can be separated from the first substrate F1 may be formed between the first layer F3 to be separated and the first separation layer F2 or may be formed between the first separation layer F2 and the first substrate F1.

In the case where the boundary is formed between the first layer F3 to be separated and the first separation layer F2, the first separation layer F2 is not included in the stack. In the case where the boundary is formed between the first separation layer F2 and the first substrate F1, the first separation layer F2 is included in the stack.

An inorganic material, an organic material, a single-layer material, a stacked-layer material in which a plurality of layers are stacked, or the like can be used for the first layer F3 to be separated.

For example, an inorganic material such as a metal oxide film, a metal nitride film, or a metal oxynitride film can be used for the first layer F3 to be separated.

Specifically, silicon oxide, silicon nitride, silicon oxynitride, an alumina film, or the like can be used for the first layer F3 to be separated.

Specifically, a resin, a resin film, plastic, or the like can be used for the first layer F3 to be separated.

Specifically, a polyimide film or the like can be used for the first layer F3 to be separated.

For example, a material having a structure in which a functional layer overlapping with the first separation layer F2 and an insulating layer that is provided between the first separation layer F2 and the functional layer and can prevent unintended diffusion of impurities which impairs the function of the functional layer are stacked can be used.

Specifically, a 0.7-mm-thick glass plate is used as the first substrate F1, and a stacked-layer material in which a 200-nm-thick silicon oxynitride film and a 30-nm-thick tungsten film are stacked in this order from the first substrate F1 side is used for the first separation layer F2. In addition, a film including a stacked-layer material in which a 600-nm-thick silicon oxynitride film and a 200-nm-thick silicon nitride film are stacked in this order from the first separation layer F2 side can be used as the first layer F3 to be separated. Note that a silicon oxynitride film refers to a film that includes more oxygen than nitrogen, and a silicon nitride oxide film refers to a film that includes more nitrogen than oxygen.

Specifically, instead of the above first layer F3 to be separated, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order from the first separation layer F2 side can be used as the first layer F3 to be separated.

Specifically, a stacked-layer material in which a polyimide film, a layer containing silicon oxide, silicon nitride, or the like and the functional layer are stacked in this order from the first separation layer F2 side can be used.

<<Functional Layer>>

The functional layer is included in the first layer F3 to be separated.

For example, a functional circuit, a functional element, an optical element, a functional film, or a layer including a plurality of elements selected from these can be used as the functional layer.

Specifically, a display element that can be used for a display device, a pixel circuit driving the display element, a driver circuit driving the pixel circuit, a color filter, a moisture-proof film, and the like, and a layer including two or more selected from these can be given.

<<Bonding Layer>>

There is no particular limitation on the bonding layer 30 as long as it bonds the first layer F3 to be separated and the base layer S5 to each other.

For the bonding layer 30, an inorganic material, an organic material, a composite material of an inorganic material and an organic material, or the like can be used.

For example, a glass layer with a melting point of 400° C. or lower, preferably 300° C. or lower, an adhesive, or the like can be used.

For example, an organic material such as a light curable adhesive, a reactive curable adhesive, a thermosetting adhesive, and/or an anaerobic adhesive can be used for the bonding layer 30.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used.

<<Base Layer>>

There is no particular limitation on the base layer S5 as long as it has heat resistance high enough to withstand a manufacturing process and a thickness and a size which can be used in a manufacturing apparatus.

A material that can be used for the base layer S5 can be the same as that of the first substrate F1, for example.

<<Separation Starting Point>>

In the processed member 80, the separation starting point F3s may be formed in the vicinity of the edges of the bonding layer 30.

The separation starting point F3s is formed by separating part of the first layer F3 to be separated, from the first substrate F1.

Part of the first layer F3 to be separated can be separated from the separation layer F2 by inserting a sharp tip into the first layer F3 to be separated, from the first substrate F1 side, or by a method using a laser or the like (e.g., a laser ablation method). Thus, the separation starting point F3s can be formed.

<<Structural Example 2 of Processed Member>>

A structure of the processed member that can be the stack and is different from the above is described with reference to FIGS. 16B1 and 16B2.

The processed member 90 is different from the processed member 80 in that the other surface of the bonding layer 30 is in contact with one surface of the second layer S3 to be separated instead of the material S5.

Specifically, the processed member 90 includes the first substrate F1 on which the first separation layer F2 and the first layer F3 to be separated whose one surface is in contact with the first separation layer F2 are formed, the second substrate S1 on which the second separation layer S2 and the second layer S3 to be separated whose other surface is in contact with the second separation layer S2 are formed, and the bonding layer 30 whose one surface is in contact with the other surface of the first layer F3 to be separated and whose other surface is in contact with the one surface of the second layer S3 to be separated (see FIGS. 16B1 and 16B2).

<<Second Substrate>>

As the second substrate S1, a substrate similar to the first substrate F1 can be used. Note that the second substrate S1 does not necessarily have the same structure as the first substrate F1.

<<Second Separation Layer>>

For the second separation layer S2, a structure similar to that of the first separation layer F2 can be used. For the second separation layer S2, a structure different from that of the first separation layer F2 can also be used.

<<Second Layer to be Separated>>

As the second layer S3 to be separated, a structure similar to that of the first layer F3 to be separated can be used. For the second layer S3 to be separated, a structure different from that of the first layer F3 to be separated can also be used.

Specifically, a structure may be employed in which the first layer F3 to be separated includes a functional circuit and the second layer S3 to be separated includes a functional layer that prevents diffusion of impurities into the functional circuit.

Specifically, a structure may be employed in which the first layer F3 to be separated includes a light-emitting element that emits light to the second layer S3 to be separated, a pixel circuit driving the light-emitting element, and a driver circuit driving the pixel circuit, and the second layer S3 to be separated includes a color filter that transmits part of light emitted from the light-emitting element and a moisture-proof film that prevents diffusion of impurities into the light-emitting element. Note that the processed member with such a structure can be used for a stack that can be used as a flexible display device.

This embodiment can be combined with any of the other embodiments described in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

REFERENCE NUMERALS

30: bonding layer, 31: adhesive layer, 32: adhesive layer, 32*b*: adhesive layer, 41: support, 41*b*: support, 42: support, 42*b*: support, 48: mask, 49: solvent, 80: processed member, 80*a*: remaining portion, 80*b*: surface layer, 81: stack, 90:

processed member, 90*a*: remaining portion, 90*b*: surface layer, 91: stack, 91*a*: remaining portion, 91*s*: starting point, 92: stack, 92*b*: processed member, 92*c*: stack, 92*d*: stack, 99: nozzle, 100: framework, 100C: framework, 100D: framework, 100E: framework, 100F: framework, 101: straight portion, 101C: straight portion, 101D: straight portion, 101E: straight portion, 101F: straight portion, 102: straight portion, 102C: straight portion, 102D: straight portion, 102E: straight portion, 102F: straight portion, 103: straight portion, 103D: straight portion, 104: straight portion, 104D: straight portion, 105D: straight portion, 106D: straight portion, 107D: straight portion, 108D: straight portion, 110: splicer, 111: curved portion, 111C: curved portion, 111D: curved portion, 111E: curved portion, 111F: curved portion, 112: curved portion, 112D: curved portion, 113: curved portion, 113D: curved portion, 114: curved portion, 114D: curved portion, 115D: curved portion, 116D: curved portion, 117D: curved portion, 118D: curved portion, 200: light-emitting panel, 200C: light-emitting panel, 200D: light-emitting panel, 208: conductive layer, 210: base, 210*a*: barrier film, 210*b*: base, 210*c*: resin layer, 219: terminal portion, 219C: terminal portion, 219D: terminal portion, 250: light-emitting element, 250D: light-emitting element, 251: lower electrode, 252: upper electrode, 253: layer, 260: sealant, 270: base, 270*a*: barrier film, 270*b*: base, 270*c*: resin layer, 300: display panel, 301: display portion, 302: pixel, 302B: sub-pixel, 302G: sub-pixel, 302R: sub-pixel, 302*t*: transistor, 303*c*: capacitor, 303*g*: scan line driver circuit, 303*s*: data line driver circuit, 303*t*: transistor, 309: flexible printed circuit, 310: base, 310*a*: barrier film, 310*b*: base, 310*c*: adhesive layer, 311: wiring, 319: terminal portion, 321: insulating film, 328: partition wall, 329: spacer, 350R: light-emitting element, 351R: lower electrode, 352: upper electrode, 353: layer, 353*a*: light-emitting unit, 353*b*: light-emitting unit, 354: intermediate layer, 360: sealant, 367BM: light-blocking layer, 367*p*: anti-reflective layer, 367R: coloring layer, 370: base, 370*a*: barrier film, 370*b*: base, 370*c*: adhesive layer, 380B: light-emitting module, 380G: light-emitting module, 380R: light-emitting module, 500: touch panel, 500B: touch panel, 501: display portion, 502R: sub-pixel, 502*t*: transistor, 503*c*: capacitor, 503*g*: scan line driver circuit, 503*t*: transistor, 509: flexible printed circuit, 510: base, 510*a*: barrier film, 510*b*: base, 510*c*: resin layer, 511: wiring, 519: terminal portion, 521: insulating film, 528: partition wall, 550R: light-emitting element, 560: sealant, 567BM: light-blocking layer, 567*p*: anti-reflective layer, 567R: coloring layer, 570: base, 570*a*: barrier film, 570*b*: base, 570*c*: resin layer, 580R: light-emitting module, 590: base, 591: electrode, 592: electrode, 593: insulating layer, 594: wiring, 595: touch sensor, 597: resin layer, 598: wiring, 599: connection layer, 1001: light-emitting device, 1001B: light-emitting device, 1001C: light-emitting device, 1001D: light-emitting device, 1002: display device, 1003: input/output device, F1: substrate, F2: separation layer, F3: layer to be separated, F3*b*: conductive layer, F3*s*: starting point, S1: substrate, S2: separation layer, S3: layer to be separated, S5: base.

This application is based on Japanese Patent Application serial no. 2014-081828 filed with Japan Patent Office on Apr. 11, 2014, the entire contents of which are hereby incorporated by reference.

The invention claimed is:

1. A light-emitting device comprising:
 a framework;
 a flexible first light-emitting panel supported by the framework; and
 a flexible second light-emitting panel supported by the framework,
 wherein the framework comprises a curved portion supporting the first light-emitting panel and the second light-emitting panel, a first straight portion supporting the first light-emitting panel so that a first developable surface is formed between the curved portion and the first straight portion, and a second straight portion supporting the second light-emitting panel so that a second developable surface which is different from the first developable surface is formed between the curved portion and the second straight portion,
 wherein the first light-emitting panel comprises a first light-emitting element and a first terminal portion electrically connected to the first light-emitting element, and
 wherein the second light-emitting panel comprises a second light-emitting element and a second terminal portion electrically connected to the second light-emitting element.

2. The light-emitting device according to claim 1,
 wherein the framework has a vertex at which the first straight portion, the second straight portion, and the curved portion are connected to each other.

3. The light-emitting device according to claim 1,
 wherein one side of the second light-emitting panel that is supported by the curved portion overlaps with one side of the first light-emitting panel that is supported by the curved portion.

4. The light-emitting device according to claim 1,
 wherein the first light-emitting panel comprises a region bent along the external shape of the first straight portion between the first light-emitting element and the first terminal portion.

5. The light-emitting device according to claim 1,
 wherein the curved portion comprises a region overlapping with the first light-emitting panel, and
 wherein the first light-emitting panel emits light to a side on which the curved portion is not provided.

6. The light-emitting device according to claim 1, further comprising a splicer,
 wherein the splicer fits with the curved portion, the first straight portion, and the second straight portion,
 wherein the curved portion comprises a first portion which fits with the splicer and a second portion which does not fit with the splicer,
 wherein the first straight portion comprises a third portion which fits with the splicer and a fourth portion which does not fit with the splicer,
 wherein the second straight portion comprises a fifth portion which fits with the splicer and a sixth portion which does not fit with the splicer,
 wherein the first portion is thinner than the second portion,
 wherein the third portion is thinner than the fourth portion, and
 wherein the fifth portion is thinner than the sixth portion.

7. The light-emitting device according to claim 1,
 wherein the first light-emitting panel comprises two curved sides that intersect with each other at one corner and a linear side opposite to the one corner.

8. A light-emitting device comprising:
 a framework;
 a flexible first light-emitting panel supported by the framework; and
 a flexible second light-emitting panel supported by the framework, wherein the framework comprises a first curved portion supporting the first light-emitting panel, a first straight portion supporting the first light-emitting panel so that a first developable surface is formed between the first curved portion and the first straight portion, and a second straight portion opposite to the first straight portion, and a second curved portion supporting the second light-emitting panel so that a second developable surface is formed between the second straight portion and the second curved portion, wherein the first light-emitting panel comprises a first light-emitting element, a first terminal portion electrically connected to the first light-emitting element, and a region bent along an external shape of the first straight portion between the first light-emitting element and the first terminal portion, and wherein the second light-emitting panel comprises a second light-emitting element, a second terminal portion electrically connected to the second light-emitting element, and a region bent along an external shape of the second straight portion between the second light-emitting element and the second terminal portion.

9. The light-emitting device according to claim 8, wherein the framework has a vertex at which the first straight portion, the second straight portion, the first curved portion, and the second curved portion are connected to each other.

10. The light-emitting device according to claim 8, wherein the first light-emitting panel comprises a region bent along the external shape of the first straight portion between the first light-emitting element and the first terminal portion.

11. The light-emitting device according to claim 8, wherein the first curved portion comprises a region overlapping with the first light-emitting panel, and wherein the first light-emitting panel emits light to a side on which the first curved portion is not provided.

12. The light-emitting device according to claim 8, further comprising a splicer,
wherein the splicer fits with the first curved portion, the second curved portion, the first straight portion, and the second straight portion,
wherein the first curved portion comprises a first portion which fits with the splicer and a second portion which does not fit with the splicer,
wherein the second curved portion comprises a third portion which fits with the splicer and a fourth portion which does not fit with the splicer,
wherein the first straight portion comprises a fifth portion which fits with the splicer and a sixth portion which does not fit with the splicer,
wherein the second straight portion comprises a seventh portion which fits with the splicer and a eighth portion which does not fit with the splicer,
wherein the first portion is thinner than the second portion,
wherein the third portion is thinner than the fourth portion,
wherein the fifth portion is thinner than the sixth portion, and
wherein the seventh portion is thinner than the eighth portion.

13. The light-emitting device according to claim 8, wherein the first light-emitting panel comprises two curved sides that intersect with each other at one corner and a linear side opposite to the one corner.

* * * * *